US010797585B2

(12) United States Patent
Chen et al.

(10) Patent No.: US 10,797,585 B2
(45) Date of Patent: Oct. 6, 2020

(54) MULTI-PHASE CONTROL FOR PULSE WIDTH MODULATION POWER CONVERTERS

(71) Applicant: SEMICONDUCTOR COMPONENTS INDUSTRIES, LLC, Phoenix, AZ (US)

(72) Inventors: Gang Chen, Taipo (HK); Gabor Reizik, Dublin, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/276,269

(22) Filed: Feb. 14, 2019

(65) Prior Publication Data

US 2019/0181746 A1 Jun. 13, 2019

Related U.S. Application Data

(63) Continuation of application No. 15/398,912, filed on Jan. 5, 2017, now Pat. No. 10,250,122.

(51) Int. Cl.
*H02M 1/15* (2006.01)
*H02M 3/156* (2006.01)
(Continued)

(52) U.S. Cl.
CPC .............. *H02M 1/15* (2013.01); *H02M 3/156* (2013.01); *H02M 3/1584* (2013.01); *H03K 7/08* (2013.01); *H02M 2003/1586* (2013.01)

(58) Field of Classification Search
CPC ............ H03K 3/017; H03K 4/00; H03K 4/02; H03K 4/023; H03K 4/026; H03K 4/04;
(Continued)

(56) References Cited

U.S. PATENT DOCUMENTS 9,007,048 B2 4/2015 Chen et al.
2007/0120547 A1* 5/2007 Tateishi ................ H02M 3/158
323/282

(Continued)

OTHER PUBLICATIONS

Gang Chen "System and Method for Controlling Switching Power Supply", U.S. Appl. No. 15/398,910, filed Jan. 5, 2017.

*Primary Examiner* — Patrick C Chen
(74) *Attorney, Agent, or Firm* — AMPACC Law Group, PLLC

(57) ABSTRACT

A controller controls Pulse Width Modulation (PWM) signals of one or more phases. The controller includes a phase sequencer to select a phase, a common ramp generator generating a common ramp signal, a phase activation circuit to turn on the PWM signal of the selected phase based on the common ramp signal, and for each phase a Current Sense plus Ramp (CSR) signal generator to generate a phase CSR signal according to a current of the phase and a phase deactivation circuit to turn off the PWM signal of the phase based on the phase CSR signal. A method of controlling PWM phases comprises selecting a phase, generating a common ramp signal, turning on the PWM signal of the selected phase based on the common ramp signal, generating CSR signals according to currents of the phases, and turning off the PWM signals based on the respective CSR signals.

20 Claims, 12 Drawing Sheets

(51) Int. Cl.
*H02M 3/158* (2006.01)
*H03K 7/08* (2006.01)

(58) Field of Classification Search
CPC .......... H03K 4/06; H03K 4/063; H03K 4/066; H03K 4/08; H03K 4/085; H03K 4/10; H03K 4/12; H03K 4/14–38; H03K 7/08; H02M 1/15; H02M 3/156; H02M 3/1563; H02M 3/157; H02M 3/158; H02M 3/1582; H02M 3/1584; H02M 3/1588
See application file for complete search history.

(56) References Cited

U.S. PATENT DOCUMENTS

2010/0156544 A1* 6/2010 Lee ...................... H03K 3/0322
 331/57
2014/0049240 A1* 2/2014 Chen ........................ G05F 1/10
 323/282

* cited by examiner

MULTI-PHASE CONTROL FOR PULSE WIDTH MODULATION POWER CONVERTERS

CROSS REFERENCE TO RELATED APPLICATION

This application is a continuation of U.S. patent application Ser. No. 15/398,912, filed Jan. 5, 2017, which is incorporated by reference in its entirety.

FIELD OF THE DISCLOSURE

The present disclosure relates generally to multi-phase Pulse Width Modulation (PWM) power converters, and more particularly to multi-phase Direct Current (DC) to DC power converters using Ramp Pulse Modulation.

BACKGROUND

The present disclosure relates, in general, to electronics, and more particularly, to circuits and method for providing power to electronic devices. In the past, various methods and structures were used to form switching power supply controllers, such as pulse width modulated (PWM) or pulse frequency modulation (PFM) controllers. The switching power supply controllers typically attempted to regulate an output voltage to a desired value.

Fixed frequency controllers, such as fixed-frequency PWM controllers, often did not respond quickly to load transients. For example, some fixed-frequency PWM controllers did not provide a consistent response to a rapid step change in the load. Also, these fixed-frequency PWM controllers often had beat frequencies that resulted in noise in the output voltage.

A Ramp Pulse Modulation (RPM) based controller is a type of PWM controller that can provide improved transient response by determining a duration of phase pulses using an average current of the output voltage. However, RPM controllers using a ripple of the average current to determine the duration of phase pulses do not function properly under certain combinations of input voltage, output voltage, and number of phases. Furthermore, phase alignment in an RPM controller using a ripple of the average current (that, the uniformity of phase distribution over time as the load varies) may be poor and may be sensitive to variations in printed circuit board (PCB) layout. This may result in some phases providing a disproportionate amount of the total output current of the power converter.

Accordingly, it is desirable to have power supply controller that can operate over a wide range of input voltage, output voltage, and phase number combinations, and in particular with a low input voltage, a large number of phases, or both. It is desirable to have power supply controller that can support pulse overlapping among phases in steady-state operation and good phase alignment.

BRIEF DESCRIPTION OF THE FIGURES

In the accompanying figures, like reference numerals refer to identical or functionally similar elements throughout the separate views, together with the detailed description below, and are incorporated in and form part of the specification to further illustrate embodiments of concepts that include the claimed invention and explain various principles and advantages of those embodiments.

Figure 1:
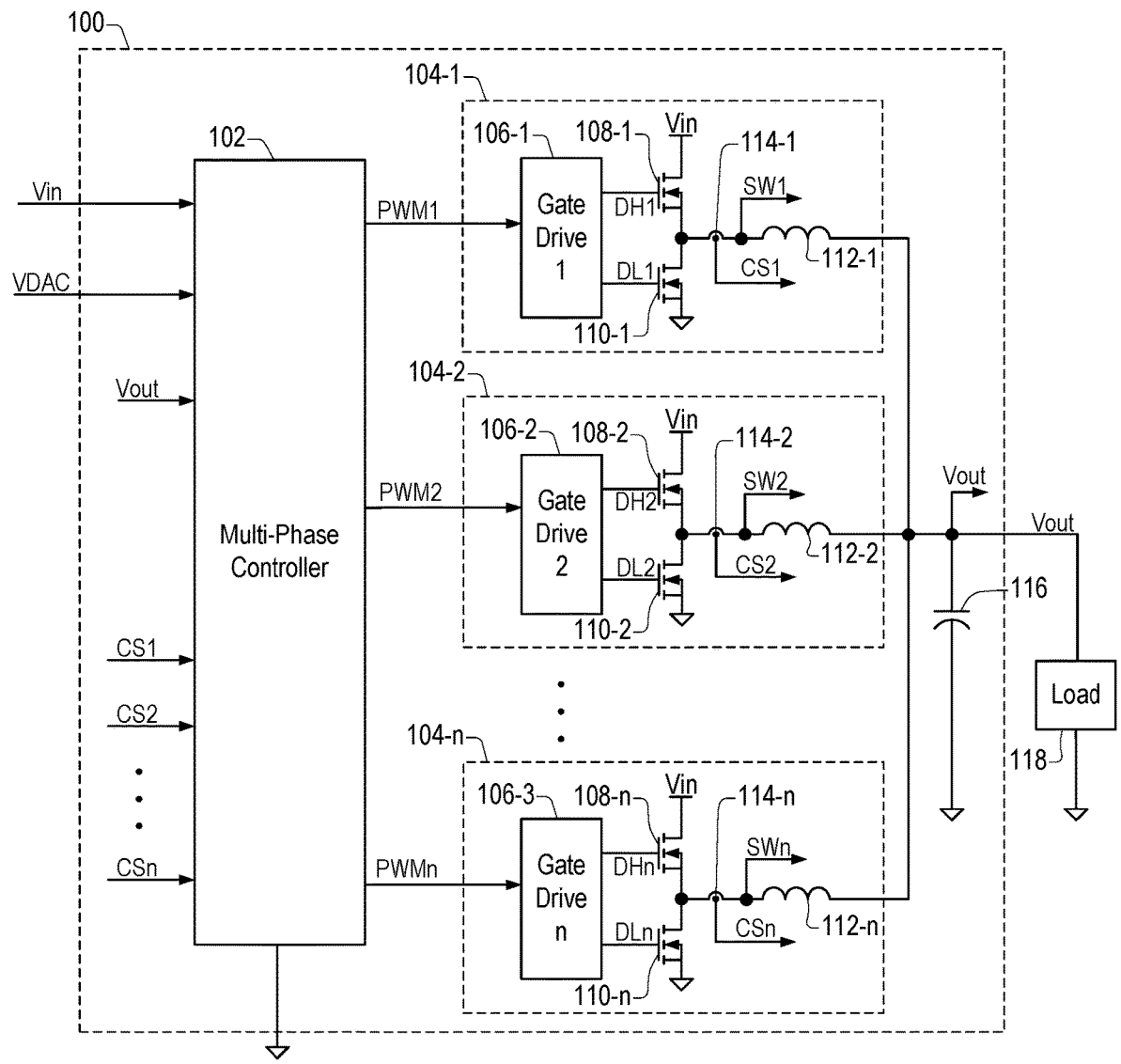
FIG. 1 illustrates a multi-phase voltage regulator circuit according to an embodiment.

Those skilled in the field of the present disclosure will appreciate that elements in the figures are illustrated for simplicity and clarity and have not necessarily been drawn to scale. For example, the dimensions of some of the elements in the figures may be exaggerated relative to other elements to help to improve understanding of the embodiments.

The apparatus and method components have been represented where appropriate by conventional symbols in the drawings, showing only those specific details that are pertinent to understanding the embodiments. This avoids obscuring the disclosure with details that will be readily apparent to those of ordinary skill in the art having the benefit of the disclosures herein. The details of well-known elements, structures, or processes that are necessary to practice the embodiments and that are well known to those of skill in the art may not be shown and should be assumed present unless otherwise indicated.

DETAILED DESCRIPTION

The present disclosure relates generally to switching power supply circuits, and in particularly to multi-phase Pules-Width Modulation (PWM) DC-to-DC power converters using Ramp Pulse Modulation (RPM).

Embodiments provide DC-to-DC power converters that may operate with a low input voltage, and in particular with an input voltage lower than an output voltage of the converter times a number of phases of the converter. Embodiments also provide DC-to-DC power converters having reduced ripple in the output voltage, improved phase alignment, and reduced current imbalance between the phases of the converter.

In one embodiment of a multi-phase converter converting an input voltage to an output voltage, the converter generates a combined ramp and current sense (CSR) signal, CSRAMP, for each phase. A PWM set circuit turns PWM pulses of the phases on one at a time in a sequence, wherein the phase to be turned on is a selected phase. Respective PWM reset circuits for the phases turn off the respective PWM pulses. The PWM set circuitry turns on the PWM pulse for the selected phase when a negative feedback error voltage crosses over a threshold voltage obtained from a sum of an adaptive common ramp signal and the CSRAMP signal of the selected phase. The PWM reset circuits respectively turn off the respective PWM pulses of the respective phases when the error voltage goes lower than the respective CSRAMP signals of the phases.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Similar reference numerals designate similar elements in the specification.

FIG. 1 illustrates a multi-phase voltage regulator (VR) circuit 100 (hereinafter, the VR circuit 100) according to an embodiment. The VR circuit 100 receives an input voltage Vin and a reference voltage VDAC and supplies an output voltage Vout to a load 118.

The VR circuit 100 includes a multi-phase controller 102 (hereinafter, the controller 102), a plurality of phase circuits 104-1 to 104-$n$, and an output capacitor 116. The controller 102 operates to produce the output voltage Vout by controlling the first to $n^{th}$ phase circuits 104-1 to 104-$n$ to provide their respective currents to the output capacitor 116.

In particular, the controller 102 generates first to $n^{th}$ Pulse Width Modulation (PWM) signals PWM1 to PWMn that respectively control operation of the first to $n^{th}$ phase circuits 104-1 to 104-$n$. The controller 102 generates the first to $n^{th}$ PWM signals PWM1 to PWMn according to values of the reference voltage VDAC, the output voltage Vout, and first to $n^{th}$ current sense (CS) signals CS1 to CSn.

The first phase circuit 104-1 includes a first gate drive circuit 106-1, a first high drive transistor 108-1, a first low drive transistor 110-1, a first inductor 112-1, and a first current sensor 114-1. In an embodiment, the first high drive transistor 108-1 and the first low drive transistor 110-1 are Field Effect Transistors (FETs), such as Metal Oxide Semiconductor FETs (MOSFETs). In an embodiment, the first high drive transistor 108-1 and the first low drive transistor 110-1 are n-channel MOSFETs (n-MOSFETs).

The first gate drive circuit 106-1 generates a first drive high signal DH1 and a first drive low signal DL1 according to a value of the first PWM signal PWM1. The first drive high signal DH1 and a first drive low signal DL1 are respectively connected to control terminals (e.g., gates) of the first high drive transistor 108-1 and first low drive transistor 110-1, respectively.

In an embodiment, when the first PWM signal PWM1 has a first value (such as a high or logical-true value), the first gate drive circuit 106-1 generates a first drive high signal DH1 to turn the first high drive transistor 108-1 on and a first drive low signal DL1 to turn the first low drive transistor 110-1 off. When the first PWM signal PWM1 has a second value (such as a low or logical-false value), the first gate drive circuit 106-1 generates a first drive high signal DH1 to turn the first high drive transistor 108-1 off and a first drive low signal DL1 to turn the first low drive transistor 110-1 on.

A first conduction terminal (e.g. a drain) of the first high drive transistor 108-1 is connected to the input voltage Vin. A second conduction terminal (e.g. a source) of the first high drive transistor 108-1 is coupled to a first end of a first inductor 112-1 through a first current sensor 114-1. A second end of the first inductor 112-1 is connected to the output capacitor 116.

A first conduction terminal (e.g. a drain) of the first low drive transistor 110-1 is also coupled to the first end of the first inductor 112-1 through the first current sensor 114-1. A second conduction terminal (e.g. a source) of the first low drive transistor 110-1 is connected to ground.

A first switching node signal SW1 is generated at the first end of the first inductor 112-1. The first current sensor 114-1 produces the first current sense signal CS1. In an embodiment, the current sensor 114-1 is an amplified current sense voltage from a current sense resistor. In another embodiment, the current sensor 114-1 is an amplified current sense voltage from a DC Resistance (DCR) of the first inductor 112-1. In an embodiment, a voltage value of the first current sense signal CS1 corresponds to an amount of current passing through the first inductor 112-1.

When the first PWM signal PWM1 has the first (e.g., high) value, the first high drive transistor 108-1 is on, the first low drive transistor 110-1 is off, current may flow from the input voltage Vin to the output capacitor 116 and the load 118, and energy is stored in a magnetic field of the first inductor 112-1. When the first PWM signal PWM1 has the second (e.g., low) value, the first high drive transistor 108-1 is off, and the first low drive transistor 110-1 is on, and the energy stored in the magnetic field of the first inductor 112-1 may be transferred to the output capacitor 116 and the load 118.

The second phase circuit 104-2 includes a second gate drive circuit 106-2, a second high drive transistor 108-2, a second low drive transistor 110-2, a second inductor 112-2, and a second current sensor 114-2. The second phase circuit 104-2 receives the second PWM signal PWM2 and generates the second current sense signal CS2.

The second phase circuit 104-2 is configured similarly to the first phase circuit 104-1. The second phase circuit 104-2 operates in the manner described for first phase circuit 104-1. A second switching node signal SW2 is generated at a first end of the second inductor 112-2.

The $n^{th}$ phase circuit 104-$n$ includes an $n^{th}$ gate drive circuit 106-$n$, an $n^{th}$ high drive transistor 108-$n$, an $n^{th}$ low drive transistor 110-$n$, an $n^{th}$ inductor 112-$n$, and an $n^{th}$ current sensor 114-$n$. The $n^{th}$ phase circuit 104-$n$ receives the $n^{th}$ PWM signal PWMn and generates the $n^{th}$ current sense signal CSn.

The $n^{th}$ phase circuit 104-$n$ is configured similarly to the first phase circuit 104-1. The $n^{th}$ phase circuit 104-$n$ operates in the manner described for first phase circuit 104-1. An $n^{th}$ switching node signal SWn is generated at a first end of the $n^{th}$ inductor 112-$n$.

In an embodiment, each of the first to $n^{th}$ gate drive circuits 106-1 to 106-$n$ operates to introduce a dead time between assertions of the respective high drive signal and low drive signal. That is, each of the first to $n^{th}$ gate drive circuits 106-1 to 106-$n$ operates so that a first dead time elapses after the respective high drive transistor is turned off before the respective low drive transistor is turned on, and a second dead time elapses after the respective low drive transistor is turned off before the respective high drive transistor is turned on.

In an embodiment, the controller 102 further receives the first to $n^{th}$ switching node voltages SW1 to SWn and uses the first to n$^{th}$ switching node voltages SW1 to SWn to generate the first to n$^{th}$ PWM signals PWM1 to PWMn.

FIG. 1 illustrates a partitioning of the VR circuit 100 according to an embodiment, but embodiments are not limited thereto. For example, in an embodiment, an integrated circuit may include the controller 102 and the first to n$^{th}$ gate drive circuits 106-1 to 106-n. In an embodiment, the integrated circuit includes a Digital to Analog Converter (DAC) configured to provide the reference voltage VDAC according to a digital indication of an output voltage value. In an embodiment, the integrated circuit may include control and interface circuits. In an embodiment, the integrated circuit may include over-current, over-voltage, under-voltage, and thermal protection circuits.

FIG. 1 illustrates the VR circuit 100 including three phases, but embodiments are not limited thereto. In an embodiment, the number of phases of the VR circuit 100 is configurable up to a predetermined maximum number. In an embodiment, the VR circuit 100 includes 2, 4, 5, or more phases.

Figure 2:
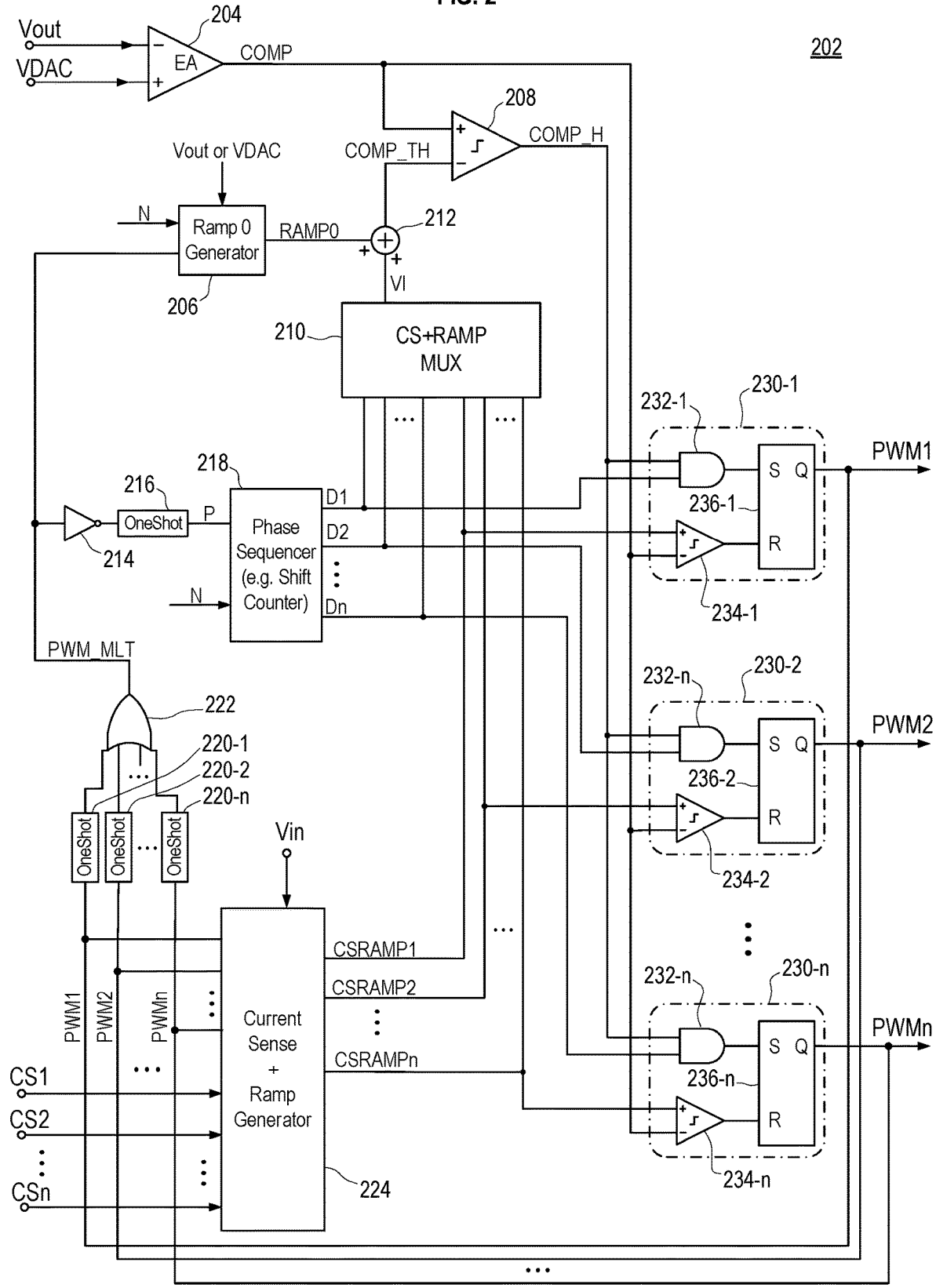
FIG. 2 illustrates a multi-phase controller circuit according to an embodiment.

FIG. 2 illustrates a multi-phase controller circuit 202 (hereinafter, controller 202), according to an embodiment. The controller 202 is suitable for use as the multi-phase controller 102 of the multi-phase voltage regulator circuit 100 of FIG. 1.

The controller 202 receives an input voltage Vin, an output voltage Vout, a reference voltage VDAC, and first to n$^{th}$ current sense (CS) signals CS1 to CSn. The controller 202 may also receive a number of phases signal N indicating a number of phases to control. The controller 202 generates first to n$^{th}$ Pulse Width Modulation (PWM) signals PWM1 to PWMn according to the received signals. In an embodiment, the number of PWM signals generated is equal to a value of the number of phases signal N.

The controller 202 includes an Error Amplifier (EA) 204, a ramp-0 generator circuit 206, an error comparator 208, a Current Sense plus Ramp (CSR) signal multiplexer 210, and a summing circuit 212. The controller 202 further includes an inverter 214, a common one-shot circuit 216, a phase sequencer circuit 218, first to n$^{th}$ phase one-shot circuits 220-1 to 220-n, and an OR gate 222. The controller 202 further includes a CSR signal generator 224 and first to n$^{th}$ Pulse Width Modulation (PWM) control circuits 230-1 to 230-n.

The EA 204 receives the output voltage Vout and the reference voltage VDAC and generates a comparison signal COMP having a value equal to the difference between the two:

$$COMP = VDAC - Vout \quad \text{Equation 1}$$

In an embodiment, the EA 204 includes a compensation network, incorporating resistors and capacitors, connected between the comparison signal COMP, the Vout signal, and an inverting input of a differential amplifier. An illustrative embodiment of an EA incorporating a compensation network is shown as the EA 1304 of FIG. 13.

The ramp-0 generator circuit 206 is a common ramp generation circuit, and receives a PWM start signal PWM_MLT, either the output voltage Vout or the reference voltage VDAC, and, in an embodiment, the number of phases signal N. In an embodiment, the PWM start signal PWM_MLT provides an indication that any one of the first to n$^{th}$ PWM signals PWM1 to PWMn has been turned on. In an embodiment, a PWM signal being turned on is indicated by a rising edge of the PWM signal.

The ramp-0 generator circuit 206 generates a common ramp signal RAMP0 according to the signals it receives. The common ramp signal RAMP0 is substantially a sawtooth or ramp signal, that is, a signal that is from time to time reset to a reset value, and then increases or decreases in a continuous fashion until the next reset occurs or a limiting value is reached. The rate of change of the sawtooth or ramp signal when it is reset is substantially larger (for example, ten times larger or more) than the rate of change during the subsequent increase or decrease.

In an embodiment, the ramp-0 generator circuit 206 resets a value of the common ramp signal RAMP0 to a value proportional to either the output voltage Vout or the reference voltage VDAC when the PWM start signal PWM_MLT indicates that any one of the first to n$^{th}$ PWM signals PWM1 to PWMn has been turned on. After the reset of the common ramp signal RAMP0 is complete, the ramp-0 generator circuit 206 reduces the value of the common ramp signal RAMP0 at a rate proportional to the value of the number of phases signal N and the output voltage Vout or the reference voltage VDAC, depending on which is received by ramp-0 generator circuit 206.

In an embodiment, the ramp-0 generator circuit 206 reduces the value of the common ramp signal RAMP0 at a rate proportional to the value of the number of phases signal N and the output voltage multiplied by a rate at which the CSR signal generator 224 increases a value of a CSR signal.

The inverter 214 receives the PWM start signal PWM_MLT and inverts it. The common one-shot circuit 216 receives the inverted version of PWM start signal PWM_MLT and generates a pulse on a pulse signal P in response of a rising edge of the inverted version of PWM start signal PWM_MLT. The inverter 214 and the common one-shot circuit 216 operate to produce a pulse in response to a falling edge of a pulse on the PWM start signal PWM_MLT.

The phase sequencer circuit 218 receives the pulse signal P, and in an embodiment also receives the number of phases signal N. The phase sequencer circuit 218 generates first to n$^{th}$ phase select signals D1 to Dn according to the pulse signal P and the value of the number of phases signal N.

In an initial state, the phase sequencer circuit 218 sets the first phase select signal D1 to an active state (e.g. a high state) and sets the second to n$^{th}$ phase select signal D2 to Dn to an inactive (e.g. low) state, indicating that the first phase is a selected phase.

Subsequently, when an i$^{th}$ phase select signal D(i) has the active state, i is less than the value of the number of phases signal N, and a pulse is received on the pulse signal P, the phase sequencer circuit 218 sets the i$^{th}$ phase select signal D(i) to the inactive state and sets the (i+1)$^{th}$ phase select signal D(i+1) to the active state. When an i$^{th}$ phase select signal D(i) has the active state, i is equal to or greater than the value of the number of phases signal N, and a pulse is received on the pulse signal P, the phase sequencer circuit 218 sets the i$^{th}$ phase select signal D(i) to the inactive state and the first phase select signal D1 to the active state.

Accordingly, the phase sequencer circuit 218 sets only one of the first to n$^{th}$ phase select signals D1 to Dn to the active state (i.e., as the active phase) at any time. The phase sequencer circuit 218 steps through the first to n$^{th}$ phase select signals D1 to Dn (when n=N), setting each to the active state (i.e., as the active phase) in turn, when a pulse is received on the pulse signal P.

In an embodiment, the phase sequencer circuit 218 comprises a circular shift register having first to n$^{th}$ bits corresponding to the first to n$^{th}$ phase select signals D1 to Dn. The circular shift register is initialized to having a one (corresponding to the active state) in the first bit and zeroes (corresponding to the inactive state) in all the second to n$^{th}$ bits, and the values in the bits are rotated each time a pulse is received on the pulse signal P.

The first to $n^{th}$ one-shot circuits 220-1 to 220-$n$ receive the first to $n^{th}$ PWM signals PWM1 to PWMn, respectively. The first to $n^{th}$ one-shot circuits 220-1 to 220-$n$ generate a pulse on output signals thereof in response to positive edges of the first to $n^{th}$ PWM signals PWM1 to PWMn, respectively. In an embodiment, the pulse has a high value (such as a logical 1).

The OR gate 222 receives the output signals of the first to $n^{th}$ one-shot circuits 220-1 to 220-$n$ and generates a PWM start signal PWM_MLT having a value equal to a logical or of the values of the outputs of the first to $n^{th}$ one-shot circuits 220-1 to 220-$n$. As a result, whenever any of the first to $n^{th}$ one-shot circuits 220-1 to 220-$n$ generates a pulse having a high value on its output signal, the OR gate 222 generates a pulse having a high value on the PWM start signal PWM_MLT.

The CSR signal generator 224 receives first to $n^{th}$ current sense (CS) signals CS1 to CSn, first to $n^{th}$ PWM signals PWM1 to PWMn, and an input voltage Vin. The CSR signal generator 224 generates first to $n^{th}$ CSR signals CSRAMP1 to CSRAMP2 according to the received signals.

The CSR signal generator 224 generates the first CSR signal CSRAMP1 according to the first CS signal CS1, the first PWM signal PWM1, and the input voltage Vin. When the first PWM signal PWM1 has a low value, indicating that a first phase is in a discharging state wherein energy is being extracted from an inductor of the first phase, the CSR signal generator 224 generates the first CSR signal CSRAMP1 having a value equal to a DC offset voltage plus a voltage proportional to a value of the CS signal CS1. When the first PWM signal PWM1 has a high value, indicating that the first phase is in a charging state wherein energy is being stored into the inductor of the first phase, the CSR signal generator 224 increases the value of the first CSR signal CSRAMP1 at a rate proportional to the input voltage Vin. Thus the first CSR signal CSRAMP1 has a value equal to a voltage proportional to the value of the first CS signal CS1 plus a value of a ramp that increases with time when the first PWM signal PWM1 has the high value.

In an embodiment, the DC offset voltage is a bias voltage selected to provide amplifiers and comparators with an operation headroom in a full operation range. In an embodiment, the DC offset voltage has a value of 1.3V.

The CSR signal generator 224 generates the second CSR signal CSRAMP2 according to the second CS signal CS2, the second PWM signal PWM2, and the input voltage Vin, in a manner analogous to how the CSR signal generator 224 generates the first CSR signal CSRAMP1. The CSR signal generator 224 generates the $n^{th}$ CSR signal CSRAMP2 according to the $n^{th}$ CS signal CSn, the $n^{th}$ PWM signal PWMn, and the input voltage Vin, in a manner analogous to how the CSR signal generator 224 generates the first CSR signal CSRAMP1. Each of the first to $n^{th}$ CSR signals CSRAMP1 to CSRAMPn is generated independently of others of the first to $n^{th}$ CSR signals CSRAMP1 to CSRAMPn.

In another embodiment, the CSR signal generator 224 receives the first to $n^{th}$ switching node signals SW1 to SW2 of FIG. 1 instead of the first to $n^{th}$ PWM signals PWM1 to PWMn, respectively. In such an embodiment, the first to $n^{th}$ switching node signals SW1 to SW2 have the effects described above for the first to $n^{th}$ PWM signals PWM1 to PWMn, respectively.

The CSR signal multiplexer 210 receives the first to $n^{th}$ phase select signals D1 to Dn and the first to $n^{th}$ CSR signals CSRAMP1 to CSRAMPn and generates a mux output signal VI according to the received signals. In particular, the CSR signal multiplexer 210 generates the mux output signal VI having a value equal to the first to $n^{th}$ CSR signals CSRAMP1 to CSRAMPn having a respective first to $n^{th}$ phase select signals D1 to Dn having the active state. In other words, the CSR signal multiplexer 210 generates the mux output signal VI having a value equal to the CSR signal of the selected phase.

The summing circuit 212 receives the mux output signal VI and the common ramp signal RAMP0 and sums the received signals to generate a comparison threshold signal COMP_TH.

The error comparator 208 receives the comparison threshold signal COMP_TH and the comparison signal COMP and generates a comparison high signal COMP_H. The error comparator 208 generates the comparison high signal COMP_H having a high value (i.e. a value corresponding to logically true) when the comparison signal COMP is greater than the comparison threshold signal COMP_TH. The error comparator 208 generates the comparison high signal COMP_H having a low value (i.e. a value corresponding to logically false) when the comparison signal COMP is less than the comparison threshold signal COMP_TH.

In an embodiment, the error comparator 208 has a predetermined amount of hysteresis to prevent spurious oscillation on the comparison high signal COMP_H.

In an embodiment, the comparison high signal COMP_H having the high signal indicates that the difference between the reference voltage VDAC and the output voltage Vout (that is, an error in the output voltage Vout) is less than the comparison threshold signal COMP_TH.

The first PWM control circuit 230-1 receives the comparison signal COMP, the first CSR signal CSRAMP1, the comparison high signal COMP_H, and the first phase select signal D1. The first PWM control circuit 230-1 generates a first PWM signal PWM1 by setting the first PWM signal PWM1 to a high state when the comparison high signal COMP_H has a high value and the first phase select signal D1 has the active state, and by resetting the first PWM signal PWM1 to a low value when a value of the comparison signal COMP is less than a value of the first CSR signal CSRAMP1.

In an embodiment, the first PWM control circuit 230-1 includes a first AND gate 232-1, a first comparator 234-1, and a first set-reset latch 236-1. An output of the first AND 232-1 gate is connected to a set input of the first set-reset latch 236-1, and an output of the first comparator 234-1 is connected to a reset input of the first set-reset latch 236-1. The first PWM signal PWM1 is an output of the first set-reset latch 236-1.

A first input of the first AND gate 232-1 receives the comparison high signal COMP_H, and a second input of the first AND gate 232-1 receives the first phase select signal D1. When the comparison high signal COMP_H and first phase select signal D1 are both high, the output of the first AND gate 232-1 goes high, causing the output of the first set-reset latch 236-1 to be set. That is, when the comparison high signal COMP_H indicates that difference between the error in the output voltage Vout is less than the comparison threshold signal COMP_TH and first phase select signal D1 has the active state, the first PWM signal PWM1 is set to a high value to indicate that current is to be provided to an inductor of the first phase.

A positive input of the first comparator 234-1 receives the first CSR signal CSRAMP1 and a negative input of the first comparator 234-1 receives the comparison signal COMP.

When the first CSR signal CSRAMP1 is greater than the comparison signal COMP, the output of the first comparator 234-1 goes high, causing the output of the first set-reset latch 236-1 to be reset. That is, when the first CSR signal CSRAMP1 is greater than an error in the output voltage Vout, the first PWM signal PWM1 is reset to a low value to indicate that current is not to be provided to the inductor of the first phase and that the energy stored in the inductor of the first stage is to be transferred to a load.

In other words, when the first phase is the selected phase and the comparison high signal COMP_H is high, the first phase is placed in a charging state wherein currents supplied to the inductor of the first phase and to a load. When the first CSR signal CSRAMP1 is greater than an error in the output voltage Vout, the first phase is taken out of the charging state and placed in a discharge state wherein energy is discharged from the inductor of the first phase into the load.

The second PWM control circuit 230-2 receives the comparison signal COMP, the second CSR signal CSRAMP2, the comparison high signal COMP_H, and the second phase select signal D2. The second PWM control circuit 230-2 generates a second PWM signal PWM2 by setting the second PWM signal PWM2 to a high state when the comparison high signal COMP_H has a high value and the second phase select signal D2 has the active state, and by resetting the second PWM signal PWM2 to a low value when a value of the comparison signal COMP is less than a value of the second CSR signal CSRAMP2.

In an embodiment, the second PWM control circuit 230-2 includes a second AND gate 232-2, a second comparator 234-2, and a second set-reset latch 236-2, which are connected as described for the first PWM control circuit 230-1. The second PWM control circuit 230-2 operates in a manner similar to that described for the first PWM control circuit 230-1.

The $n^{th}$ PWM control circuit 230-n receives the comparison signal COMP, the $n^{th}$ CSR signal CSRAMPn, the comparison high signal COMP_H, and the $n^{th}$ phase select signal Dn. The $n^{th}$ PWM control circuit 230-n generates a $n^{th}$ PWM signal PWMn by setting the $n^{th}$ PWM signal PWMn to a high state when the comparison high signal COMP_H has a high value and the $n^{th}$ phase select signal Dn has the active state, and by resetting the $n^{th}$ PWM signal PWMn to a low value when a value of the comparison signal COMP is less than a value of the $n^{th}$ CSR signal CSRAMPn.

In an embodiment, the $n^{th}$ PWM control circuit 230-n includes an $n^{th}$ AND gate 232-n, an $n^{th}$ comparator 234-n, and an $n^{th}$ set-reset latch 236-n, which are connected as described for the first PWM control circuit 230-1. The $n^{th}$ PWM control circuit 230-n operates in a manner similar to that described for the first PWM control circuit 230-1.

Each of the first to $n^{th}$ PWM control circuits 231-1 to 230-n operates independently of the other of the first to $n^{th}$ PWM control circuits 231-1 to 230-n. Each can initiate the charging state of the respective phase when selected as the active phase by the respective phase select signal, according to the value of the comparison high signal COMP_H. Each can end the charging state and begin the discharge state of the respective phase at any time, according to the values of comparison signal COMP and the respective CSR signal. As a result, any number of phases (including zero) can be in the charging state at any given time, and any number of phases (including zero) can be in the discharging state at any given time.

Figure 3:
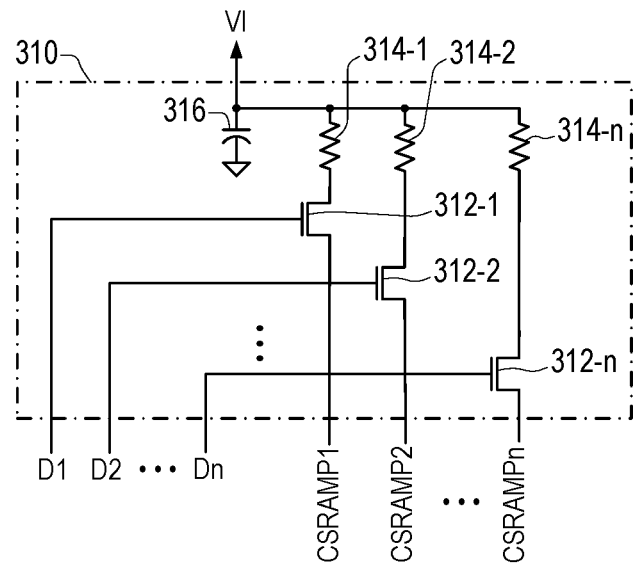
FIG. 3 illustrates a current sense ramp multiplexer circuit according to an embodiment.

FIG. 3 illustrates a CSR multiplexer circuit 310 according to an embodiment. The CSR multiplexer circuit 310 is suitable for use in the CSR multiplexer circuit 210 of FIG. 2.

The CSR multiplexer circuit 310 receives first to $n^{th}$ phase select signals D1 to Dn and first to $n^{th}$ CSR signals CSRAMP1 to CSRAMPn. The CSR multiplexer circuit 310 produces a multiplexer output signal VI by selecting one of the first to $n^{th}$ CSR signals CSRAMP1 to CSRAMPn according to values of the first to $n^{th}$ phase select signals D1 to Dn.

The CSR multiplexer circuit 310 includes first to $n^{th}$ transistors 312-1 to 312-n. In an embodiment, the first to $n^{th}$ transistors 312-1 to 312-n include respective n-channel MOSFETs.

Control terminals (e.g., gates) of the first to $n^{th}$ transistors 312-1 to 312-n are respectively coupled to the first to $n^{th}$ phase select signals D1 to Dn. First conduction terminals of the first to $n^{th}$ transistors 312-1 to 312-n are respectively coupled to the first to $n^{th}$ CSR signals CSRAMP1 to CSRAMPn. Second conduction terminals of the first to $n^{th}$ transistors 312-1 to 312-n are coupled to the multiplexer output signal VI.

The first to $n^{th}$ transistors 312-1 to 312-n conduct when the respective first to $n^{th}$ phase select signals D1 to Dn has an active (e.g. a high) value, electrically coupling the respective first to $n^{th}$ CSR signals CSRAMP1 to CSRAMPn to the multiplexer output signal VI.

In an embodiment, the CSR multiplexer circuit 310 further includes first to $n^{th}$ resistors 314-1 to 314-n and a capacitor 316. The first to $n^{th}$ resistors 314-1 to 314-n and the capacitor 316 operate as a low pass filter to attenuate rapid changes in the value of the multiplexer output signal VI caused by, for example, switching of the first to $n^{th}$ transistors 312-1 to 312-n.

The first to $n^{th}$ resistors 314-1 to 314-n are respectively coupled between the second conduction terminals of the first to $n^{th}$ transistors 312-1 to 312-n and the multiplexer output signal VI. A first terminal of the capacitor 316 is coupled to the multiplexer output signal VI. A second terminal of the capacitor 316 is coupled to ground. In an embodiment, the first to $n^{th}$ resistors 314-1 to 314-n each have a resistance of 1 kOhm, and the capacitor 316 has a capacitance of 1 pF.

Figure 4:
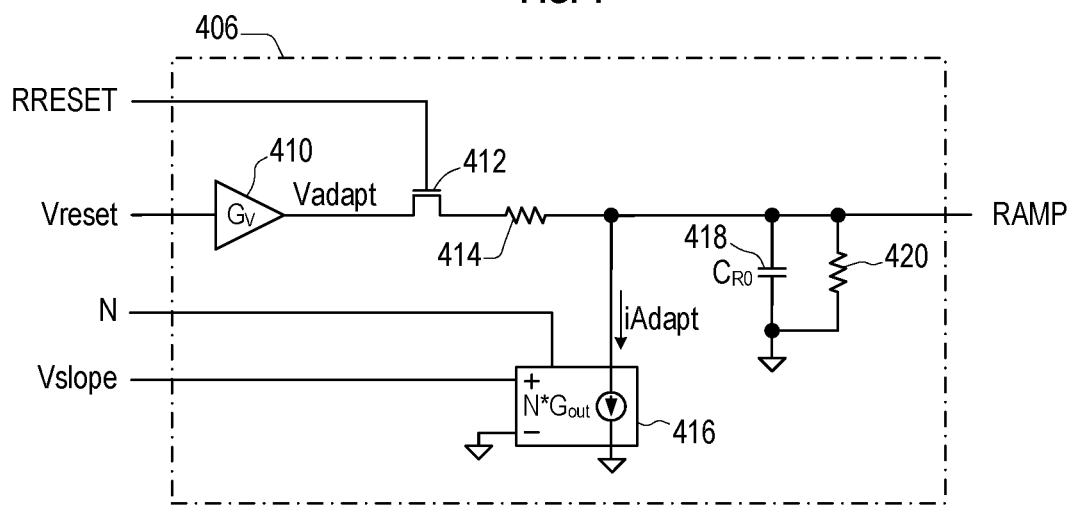
FIG. 4 illustrates a ramp generator circuit according to an embodiment.

FIG. 4 illustrates a ramp generator circuit 406 according to an embodiment. The ramp generator circuit 406 is suitable for use in the ramp-0 generator circuit 206 of FIG. 2.

The ramp generator circuit 406 receives a ramp reset signal RRESET, a slope control voltage Vslope, a reset control voltage Vreset, and a slope scaling value N. The ramp generator circuit 406 produces a ramp signal RAMP according to the received signals.

In an embodiment, the ramp reset signal RRESET is the PWM start signal PWM_MLT of FIG. 2 and the ramp signal RAMP is the common ramp signal RAMP0 of FIG. 2.

In embodiments, the slope control voltage Vslope may be the output voltage Vout of FIG. 2 or the reference voltage VDAC of FIG. 2. In embodiments, the reset control voltage Vreset may be the output voltage Vout or the reference voltage VDAC. In embodiments, the slope control voltage Vslope is coupled to a same signal as the reset control voltage Vreset. In an embodiment, the slope scaling value N is proportional to a number of phases of a multi-phase power controller.

The ramp generator circuit 406 clamps the value of the ramp signal RAMP to a voltage proportional to the reset control voltage Vreset when the Ramp reset signal RRESET has a high value. The ramp generator circuit 406 reduces the value of the ramp signal RAMP at a rate proportional to the slope control signal Vslope and the slope scaling value N when the ramp reset signal RRESET has a low value.

The ramp generator circuit 406 includes an amplifier 410, a transistor 412, a current sink 416, and a capacitor 418. In some embodiments, the ramp generator circuit 406 further includes a first resistor 414, a second resistor 420, or both.

An input of the amplifier 410 receives the reset control voltage Vreset. An output of the amplifier 410 produces an adaptive voltage signal Vadapt and is connected to a first conduction terminal of the transistor 412. The adaptive voltage signal Vadapt has a value proportional to a value of the reset control voltage Vreset.

A control terminal (e.g., a gate) of the transistor 412 receives the ramp reset signal RRESET. A second conduction terminal of the transistor 412 is coupled to a first terminal of the capacitor 418. In an embodiment, the transistor 412 is a FET, such as an n-channel MOSFET.

In an embodiment, the second conduction terminal of the transistor 412 is coupled to the first terminal of the capacitor 418 through the first resister 414. The first resistor 414 operates to limit a current flow from the transistor 412 to the capacitor 418.

The current sink 416 receives the slope control voltage Vslope and the slope scaling value N. An output terminal of the current sink 416 is connected to the first terminal of the capacitor 418. The current sink 416 generates an adaptive sink current iAdapt having a value proportional to a product of a value of the slope control voltage Vslope and the slope scaling value N.

The ramp generator circuit 406 produces the ramp signal RAMP at the first terminal of the capacitor 418. A second terminal of the capacitor 418 is connected to ground. The capacitor 418 has a capacitance $C_{RO}$. In an embodiment, the capacitance $C_{RO}$ has a value substantially equal to a value of a capacitance of a capacitor in a ramp generating circuit of the CSR signal generator 224 of FIG. 2, such as the capacitance $C_{CR}$ of the capacitor 518 of FIG. 5B.

In an embodiment, the second resistor 420 is connected across the capacitor 418 and operates to bleed charge off of the capacitor 418 when the ramp generator circuit 406 is inactive.

The capacitor 418 is connected to the adaptive voltage Vadapt by the transistor 412 when the ramp reset signal RRESET is high. The capacitor 418 is discharged by the adaptive sink current iAdapt when the ramp reset signal RRESET is high.

In an embodiment wherein the ramp reset signal RRESET includes high pulses indicating that a charging state has been initiated in any of a plurality of PWM phases, the ramp signal RAMP produced at the first terminal of the capacitor 418 has a sawtooth waveform. The ramp signal RAMP is set to the adaptive voltage Vadapt in response to the initiation of the charging state in any of the plurality of PWM phases. Subsequently, the ramp signal RAMP decreases at a rate proportional to the adaptive sink current iAdapt until the next high pulse on the ramp reset signal RRESET, that is, until the next initiation of a charging state in any of a plurality of PWM phases.

Figure 5A:
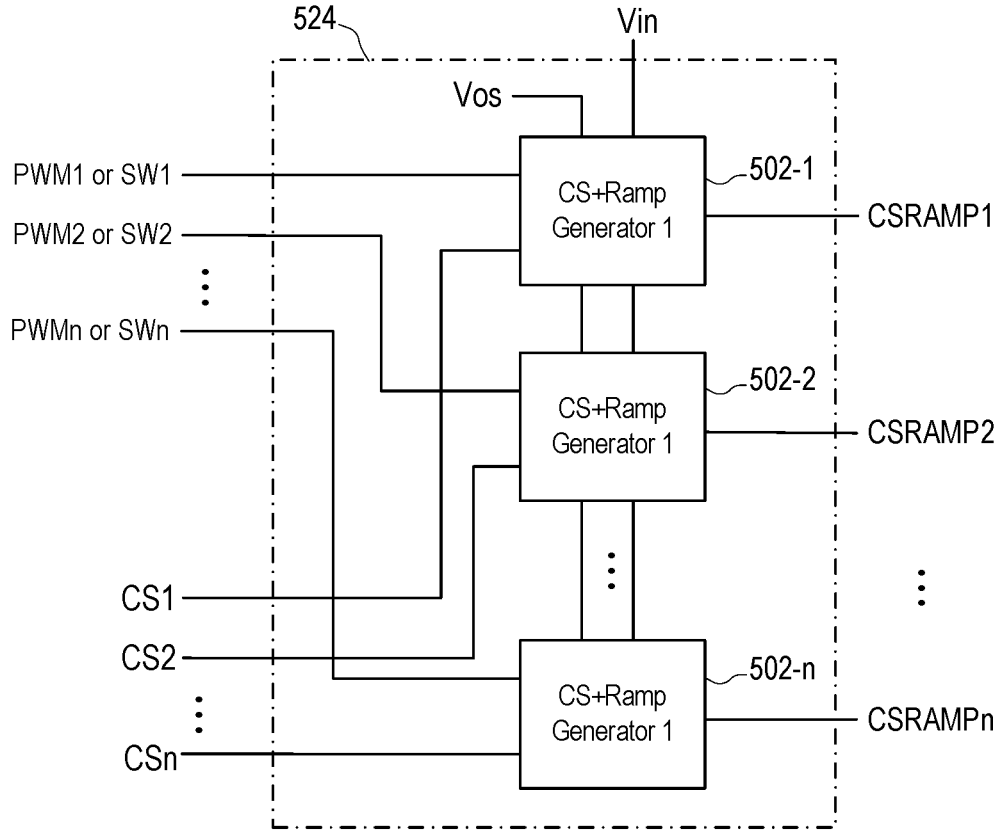
FIG. 5A illustrates a Current Sense plus Ramp (CSR) signal generator according to an embodiment.
Figure 5B:
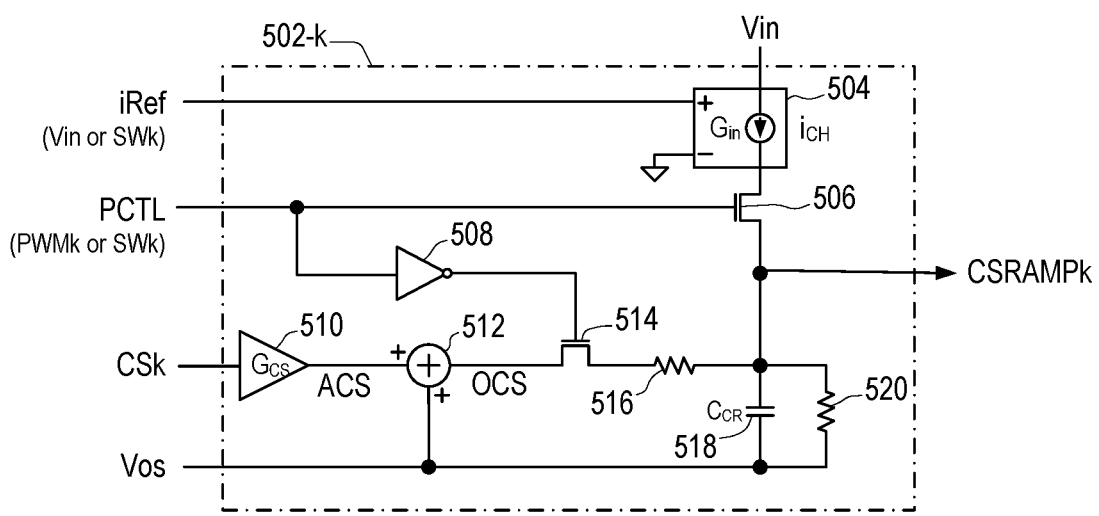
FIG. 5B illustrates a CSR generator circuit according to an embodiment.

In an embodiment, a transconductance gain $G_{out}$ of the current sink 416 is substantially the same as a transconductance gain of a current source of a ramp generating circuit of the CSR signal generator 224 of FIG. 2, such as the transconductance gain $G_{in}$ of the current source 504 of FIG. 5B. The transconductance gain $G_{out}$ may be equal to a switching frequency $f_{SW}$ times a constant k, where the constant k has units of amps per volt per Hertz (A/V/Hz). In an embodiment, the constant k is a design parameter. In an embodiment, the switching frequency $f_{SW}$ is a target nominal frequency.

In an embodiment, a magnitude of the adaptive current iAdapt and a voltage gain Gv of the amplifier 410 may be determined according to Equations 2 and 3, respectively:

$$iAdapt = N \times Gout \times Vslope = N \times k \times f_{SW} \times Vslope \qquad \text{Equation 2}$$

$$Gv = k/C_{R0} \qquad \text{Equation 3}$$

FIG. 5A illustrates a CSR signal generator 524 according to an embodiment. The CSR signal generator 524 is suitable for use in the CSR signal generator 224 of FIG. 2. The CSR signal generator 524 includes first to $n^{th}$ CSR generator circuits 502-1 to 502-n.

The CSR signal generator 524 receives the input voltage Vin and supplies it to the first to $n^{th}$ CSR generator circuits 502-1 to 502-n. The CSR signal generator 524 either receives or internally generates a DC offset voltage Vos and supplies it to the first to $n^{th}$ CSR generator circuits 502-1 to 502-n. The CSR signal generator 524 receives first to $n^{th}$ CS signals CS1 to CSn and supplies them to the first to $n^{th}$ CSR generator circuits 502-1 to 502-n, respectively.

In an embodiment, the CSR signal generator 524 receives first to $n^{th}$ PWM signals PWM1 to PWMn and provides them to the first to $n^{th}$ CSR generator circuits 502-1 to 502-n, respectively. In an embodiment, the first to $n^{th}$ PWM signals PWM1 to PWMn are the first to $n^{th}$ PWM signals PWM1 to PWMn of FIG. 1.

In another embodiment, the CSR signal generator 524 receives first to $n^{th}$ switching node voltages SW1 to SWn and provides them to the first to $n^{th}$ CSR generator circuits 502-1 to 502-n, respectively. In an embodiment, the first to $n^{th}$ switching node voltages SW1 to SWn are the first to $n^{th}$ switching node voltages SW1 to SWn of FIG. 1.

The first to $n^{th}$ CSR generator circuits 502-1 to 502-n respectively generate first to $n^{th}$ CSR signals CSRAMP1 to CSRAMPn in the manner described for the CSR generator circuit 502-k of FIG. 5B, described below.

FIG. 5B illustrates a CSR generator circuit 502-k according to an embodiment. The CSR generator circuit 502-k is suitable for use in any or all of the first to $n^{th}$ CSR generator circuits 502-1 to 502-n of FIG. 5A.

The CSR generator circuit 502-k receives an input voltage Vin, an offset voltage Vos, a current reference signal iRef, a phase control signal PCTL, and a current sense (CS) signal CSk. The CS signal CSk is a current sense signal of a $k^{th}$ phase.

In an embodiment, the CS signal CSk is obtained by inductor current sensing. In another embodiment, the CS signal CSk is obtained by MOSFET current sensing.

In an embodiment, the current reference signal iRef is the input voltage Vin.

In an embodiment, the current reference signal iRef is the a $k^{th}$ phase switching node voltage SWk, in order to provide good adaptive pulse width control of a $k^{th}$ phase PWM signal.

In an embodiment, the phase control signal PCTL is a $k^{th}$ phase PWM signal PWMk.

In an embodiment, the phase control signal PCTL is the $k^{th}$ phase switching node voltage SWk. In an embodiment, both the phase control signal PCTL and the current reference signal iRef are the $k^{th}$ phase switching node voltage SWk.

The CSR generator circuit 502-k produces a CSR signal CSRAMPk according to the signals received the CSR generator circuit 502-k. In an embodiment, the CSR signal CSRAMPk is a $k^{th}$ phase CSR signal.

When the phase control signal PCTL has a low value, the CSR generator circuit 502-*k* produces the CSR signal CSRAMPk having a value equal to a sum of a value of the offset voltage Vos and a voltage proportional to a value of the CS signal CSk. When the phase control signal PCTL has a high value, the CSR generator circuit 502-*k* increases the value of the CSR signal CSRAMPk at a rate proportional to a value of the current reference signal iRef.

The CSR generator circuit 502-*k* includes a current source 504, a first transistor 506, an inverter 508, an amplifier 510, a summing circuit 512, a second transistor 514, and a capacitor 518. In some embodiments, the CSR generator circuit 502-*k* further includes a first resistor 516, a second resistor 520, or both.

The current source 504 provides, at an output, a charging current $i_{CH}$ proportional to the value of the current reference signal iRef. In an embodiment, the current source 504 provides the charging current $i_{CH}$ proportional to a product of the value of the current reference signal iRef and a switching frequency $f_{SW}$:

$$i_{CH} = Gin \times iRef = k \times f_{SW} \times iRef, \quad \text{Equation 4}$$

where Gin is a transconductance gain of the current source 504 and k is a constant. In an embodiment, the switching frequency $f_{SW}$ is a target nominal frequency.

The first transistor 506 is coupled between the output of the current source 504 and a first terminal of the capacitor 518 and receives the phase control signal PCTL at a control terminal (such as a gate). The first transistor 506 provides the charging current $i_{CH}$ to the first terminal of the capacitor 518 when the phase control signal PCTL has the high value, and prevents the charging current $i_{CH}$ from being provided to the first terminal of the capacitor 518 when the phase control signal PCTL has the low value. In an embodiment, the first transistor 506 includes a FET, such as an n-channel MOSFET.

The inverter 508 outputs a high value when the phase control signal PCTL has the low value, and outputs a low value when the phase control signal PCTL has the high value.

The amplifier 510 generates an amplified current sense signal ACS proportional to a value of the CS signal CSk. In an embodiment, a value of the amplified current sense signal ACS is determined according to:

$$ACS = G_{CS} \times CSk \quad \text{Equation 5}$$

where $G_{CS}$ is a gain of the amplifier 510.

The summing circuit 512 receives the amplified current sense signal ACS and the offset voltage Vos. The summing circuit 512 generates, at an output, an offset current sense signal OCS that is equal to the value of the amplified current sense signal ACS and a value of the offset voltage Vos.

The second transistor 514 is coupled between the output of the summing circuit 512 and the first terminal of the capacitor 518. A control terminal of the second transistor 514 (such as a gate) receives the output of the inverter 508. The second transistor 514 provides the offset current sense signal OCS to the first terminal of the capacitor 518 when the phase control signal PCTL has the low value, and prevents the offset current sense signal OCS being supplied to the first terminal of the capacitor 518 when the phase control signal PCTL has the high value.

In an embodiment, the first resistor 516 is coupled between the second transistor 514 and the first terminal of the capacitor 518. The first resistor 516 is a low-pass filter resistor. In an embodiment, a time constant equal to a product of a resistance of the first resistor 516 and a capacitance of the capacitor 518 is much smaller than a period of a nominal switching frequency of a switched power supply incorporating the CSR generator circuit 502-*k*, such as a period of the switching frequency $f_{SW}$.

A second terminal of the capacitor 518 is coupled to the offset voltage Vos.

In an embodiment, the second resister 520 is coupled between the first and second terminals of the capacitor 518. The second resister 520 provides a bias voltage for the ramp signal CSRAMPk, especially when a pulse skipping operation is enabled.

In an embodiment, a resistance of the second resistor 520 is much higher resistance than the resistance of the first resistor 516. For example, the resistance of the second resistor 520 may be a hundred times or more the resistance of the first resistor 516.

Figure 6:
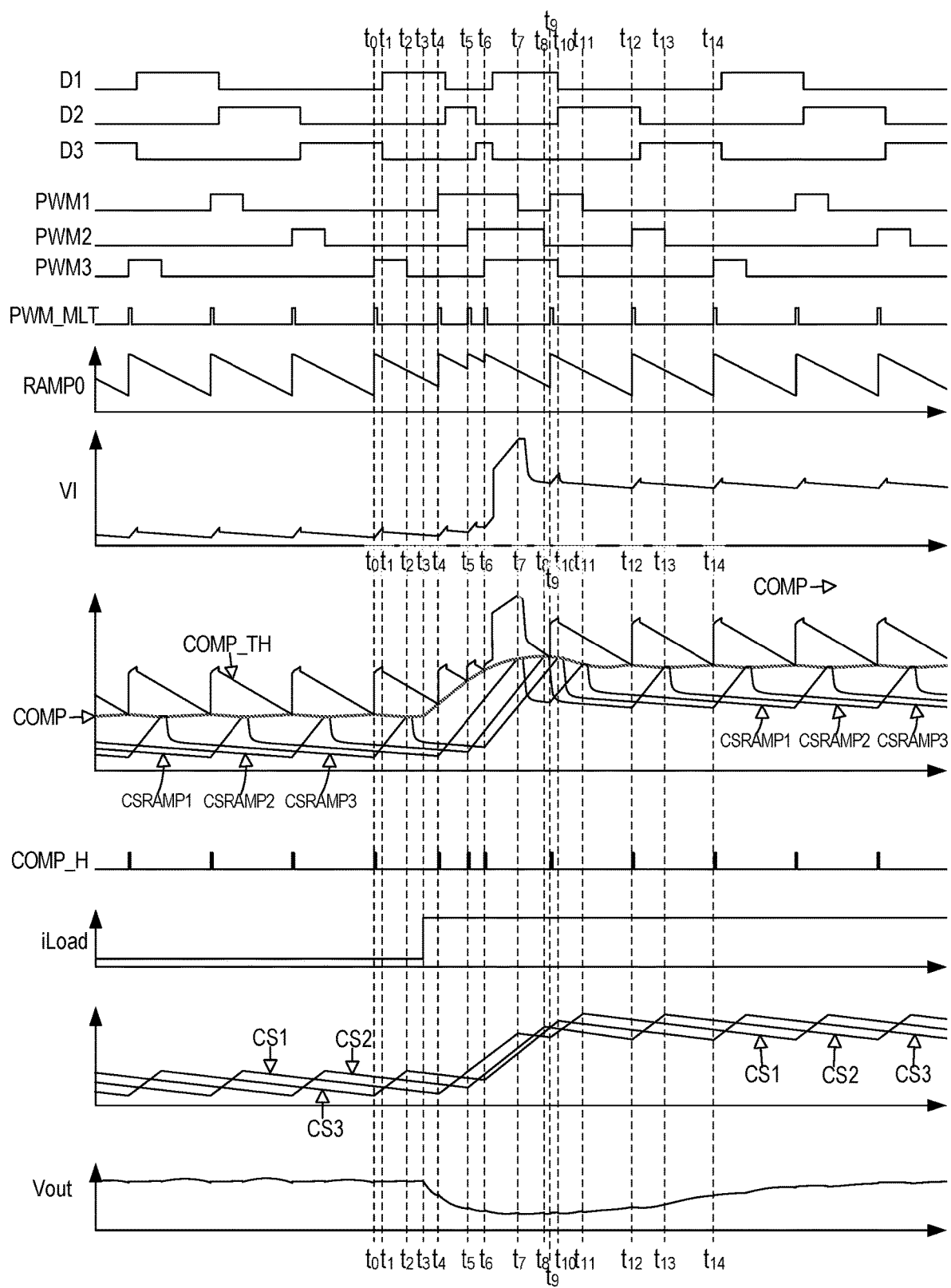
FIG. 6 is a waveform diagram illustrating operations of a multi-phase voltage regulator circuit, according to an embodiment.

FIG. 6 is a waveform diagram illustrating operations of a multi-phase voltage regulator circuit, such as the VR circuit 100 of FIG. 1, according to an embodiment. The multi-phase voltage regulator circuit includes a multi-phase controller circuit, such as the controller 202 of FIG. 2. The waveforms illustrated in FIG. 6 correspond to like-named signals in FIGS. 1 and 2, with signals of the form D3, PWM3, and the like respectively corresponding to Dn, PWMn, and the like.

FIG. 6 illustrates waveforms corresponding to a multi-phase voltage regulator circuit having three phases, but embodiments are not limited thereto.

FIG. 6 includes waveforms for first to third phase select signals D1 to D3, first to third PWM signals PWM1 to PWM3, and a PWM start signal PWM_MLT, which in an embodiment are digital signals having a high (i.e. true) state and a low (i.e. false) state.

FIG. 6 includes waveforms for a common ramp signal RAMP0, a mux output signal VI, a comparison signal COMP, a comparison threshold signal COMP_TH, and first to third CSR signals CSRAMP1 to CSRAMP3, which are analog signals. FIG. 6 also includes a waveform for a comparison high signal COMP_H, which is a digital signal.

In an embodiment, the comparison signal COMP corresponds to an error in an output voltage Vout relative to a reference voltage, and increases when the output voltage Vout decreases with respect to the reference voltage.

Finally, FIG. 6 includes a load current iLoad waveform corresponding to a current through a load of the multi-phase voltage regulator circuit (such as load 118 of FIG. 1), waveforms for first to third current sense (CS) signals CS1 to CS3 corresponding to respective currents through inductors of first to third phases, and a waveform corresponding to the output voltage Vout.

The operation of the multi-phase voltage regulator circuit will be described beginning immediately before a time t0.

Immediately before the time t0, the first and second phase select signals D1 and D2 are low and the third phase select signal D3 is high, indicating that the third phase is a candidate for entering a charging state and first and second phases are not. That is, the third phase select signal D3 is high to indicate that the third phase is the selected phase. The first to third PWM signals PWM1 to PWM3 are all low, indicating that all of the phases are in respective discharge states and none of the phases are in the charging state. Accordingly, respective currents in the energy storage inductors of the first to third phase are decreasing as the inductors discharge, as indicated by the decline of the first to third CS signals CS1 to CS3.

The common ramp signal RAMP0 was set to a predetermined value when the PWM start signal PWM_MLT last went high, that is, when the previous selected phase (the second phase) entered the charging state in response to the corresponding PWM signal (second PWM signal PWM2) going high. Immediately before the time t0, the common ramp signal RAMP0 is decreasing because the PWM start signal PWM_MLT is low.

Immediately before the time t0, the first to third CSR signals CSRAMP1 to CSRAMP3 are driven to a value proportional to the first to third CS signals CS1 to CS3 as a result of the first to third PWM signals PWM1 to PWM3 being low, respectively. That is, when the first to third phases are respectively in the discharge state, the first to third CSR signals CSRAMP1 to CSRAMP3 have a value proportional to the first to third CS signals CS1 to CS3, respectively.

The mux output signal VI has a value corresponding to a value of the CSR signal of the selected phase. Accordingly, immediately before the time t0, when the third phase is the selected phase, the mux output signal VI has a value corresponding to a value of the third CSR signal CSRAMP3.

The comparison threshold signal COMP_TH has a value equal to a sum of the mux output signal VI and the common ramp signal RAMP0. Immediately before the time t0, the comparison threshold signal COMP_TH is higher than the comparison signal COMP. The comparison signal COMP has a value proportional to an error in the output voltage Vout.

The comparison high signal COMP_H has a low value when the comparison threshold signal COMP_TH is greater than the comparison signal COMP and a high value otherwise. Accordingly, immediately before the time t0, comparison high signal COMP_H has a low value.

Then, at the time t0, the comparison threshold signal COMP_TH acquires a value less than (or, in another embodiment, less than or equal to) the comparison signal COMP, and as a result the comparison high signal COMP_H goes high.

In response to the comparison high signal COMP_H having the high value, the PWM signal of the selected phase goes high. At the time t0, the third phase select signal D3 is high, indicating that the third phase is the selected phase, so the third PWM signal PWM3 goes high.

In response to the third PWM signal PWM3 going high, the PWM start signal PWM_MLT pulses to a high value. In response to the PWM start signal PWM_MLT pulsing to the high value, the common ramp signal RAMP0 is reset to the predetermined value. Once the common ramp signal RAMP0 is reset to the predetermined value, the comparison threshold signal COMP_TH is greater than the comparison signal COMP, and in response, the comparison high signal COMP_H goes low.

When the third PWM signal PWM3 is high, the third phase is in the charging state, the current through an energy storage inductor of the third phase and into a load increases, and accordingly the value of the third CS signal CS3 increases. Also, when the third PWM signal PWM3 is high, the third CSR signal CSRAMP3 increases. In an embodiment, the third CSR signal CSRAMP3 increases at a rate proportional to an input voltage Vin. In another embodiment, the third CSR signal CSRAMP3 increases at a rate proportional to a voltage value of a switching node of the third phase, such as, for example, the value of an $n^{th}$ switching node voltage SWn of FIG. 1, where n equals 3.

At a time t1 occurring a predetermined interval after the PWM start signal PWM_MLT went high, the selected phase is rotated. The third phase select signal D3 goes low and the first phase select signal D1 goes high, indicating that the first phase is now the selected phase. That is, in response to any of the PWM signals going high, the selected phase is rotated to the next phase after the predetermined interval.

At the time t1, because the first phase select signal D1 is high indicating that the first phase is the selected phase, the mux output signal VI has a value corresponding to a value of the first CSR signal CSRAMP1. The comparison threshold signal COMP_TH then has a value equal to the sum of the common ramp signal RAMP0 and the mux output signal VI, which at this time corresponds to a sum of the values of the common ramp signal RAMP0 and the first CSR signal CSRAMP1.

At a time t2, a value of the third CSR signal CSRAMP3 exceeds a value of the comparison signal COMP, and in response the third PWM signal PWM3 goes low. When the third PWM signal PWM3 is low, the third phase is in the discharging state, the current in the energy storage inductor of the third phase decreases and the value of the third CS signal CS3 decreases accordingly, and the third CSR signal CSRAMP3 is decreased until it equals a value proportional to the value of the third CS signal CS3.

At a time t3, the load current iLoad being drawn by a load of the regulator increases. As a result, the output voltage Vout begins to decrease, causing the comparison signal COMP to increase.

At a time t4, the comparison threshold signal COMP_TH acquires a value less than (or, in another embodiment, less than or equal to) the comparison signal COMP, and as a result the comparison high signal COMP_H goes high.

In response to the comparison high signal COMP_H having the high value, the PWM signal of the selected phase goes high. At the time t4, the first phase select signal D1 is high, indicating that the first phase is the selected phase, so the first PWM signal PWM1 goes high.

In response to the first PWM signal PWM1 going high, the PWM start signal PWM_MLT pulses to a high value. In response to the PWM start signal PWM_MLT pulsing to the high value, the common ramp signal RAMP0 is reset to the predetermined value. Once the common ramp signal RAMP0 is reset to the predetermined value, the comparison threshold signal COMP_TH is greater than the comparison signal COMP, and in response, the comparison high signal COMP_H goes low.

When the first PWM signal PWM1 is high, the first phase is in the charging state, the current in an energy storage inductor of the first phase increases, and accordingly the value of the first CS signal CS1 increases. Also, when the first PWM signal PWM1 is high, the first CSR signal CSRAMP1 increases. In an embodiment, the first CSR signal CSRAMP1 increases at a rate proportional to an input voltage Vin. In another embodiment, the first CSR signal CSRAMP1 increases at a rate proportional to a voltage value of a switching node of the first phase, such as, for example, the value of an first switching node voltage SW1 of FIG. 1.

A predetermined interval after the PWM start signal PWM_MLT went high at the time T4, the selected phase is rotated. The first phase select signal D1 goes low and the second phase select signal D2 goes high, indicating that the second phase is now the selected phase. Because the second phase select signal D2 indicates that the second phase is the selected phase, the mux output signal VI has a value corresponding to a value of the second CSR signal CSRAMP2. The comparison threshold signal COMP_TH then has a value equal to the sum of the common ramp signal RAMP0 and the mux output signal VI, which at this time corresponds to a sum of the values of the common ramp signal RAMP0 and the second CSR signal CSRAMP2.

At a time t5, the comparison threshold signal COMP_TH acquires a value less than the comparison signal COMP, and as a result the comparison high signal COMP_H goes high.

In response to the comparison high signal COMP_H having the high value, the PWM signal of the selected phase goes high. At the time t5, the second phase select signal D2 is high, indicating that the second phase is the selected phase, so the second PWM signal PWM2 goes high.

In response to the second PWM signal PWM2 going high, the PWM start signal PWM_MLT pulses to a high value. In response to the PWM start signal PWM_MLT pulsing to the high value, the common ramp signal RAMP0 is reset to the predetermined value. Once the common ramp signal RAMP0 is reset to the predetermined value, the comparison threshold signal COMP_TH is greater than the comparison signal COMP, and in response, the comparison high signal COMP_H goes low.

When the second PWM signal PWM2 is high, the second phase is in the charging state, the current in an energy storage inductor of the second phase increases, and accordingly the value of the second CS signal CS2 increases. Also, when the second PWM signal PWM2 is high, the second CSR signal CSRAMP2 increases. In an embodiment, the second CSR signal CSRAMP2 increases at a rate proportional to an input voltage Vin. In another embodiment, the second CSR signal CSRAMP2 increases at a rate proportional to a voltage value of a switching node of the second phase, such as, for example, the value of an second switching node voltage SW2 of FIG. 1.

Note that immediately after the time t5, both the first and second PWM signals PWM1 and PWM2 are high, indicating that both the first and second phases are in the charging state.

A predetermined interval after the PWM start signal PWM_MLT went high at the time T5, the selected phase is rotated. The second phase select signal D2 goes low and the third phase select signal D3 goes high, indicating that the third phase is now the selected phase. Because the third phase select signal D3 indicates that the third phase is the selected phase, the mux output signal VI has a value corresponding to a value of the third CSR signal CSRAMP3. The comparison threshold signal COMP_TH then has a value equal to the sum of the common ramp signal RAMP0 and the mux output signal VI, which at this time corresponds to a sum of the values of the common ramp signal RAMP0 and the third CSR signal CSRAMP3.

At a time t6, the comparison threshold signal COMP_TH acquires a value less than the comparison signal COMP, and as a result the comparison high signal COMP_H goes high.

In response to the comparison high signal COMP_H having the high value, the PWM signal of the selected phase goes high. At the time t6, the third phase select signal D3 is high, indicating that the third phase is the selected phase, so the third PWM signal PWM3 goes high.

In response to the third PWM signal PWM3 going high, the PWM start signal PWM_MLT pulses to a high value. In response to the PWM start signal PWM_MLT pulsing to the high value, the common ramp signal RAMP0 is reset to the predetermined value. Once the common ramp signal RAMP0 is reset to the predetermined value, the comparison threshold signal COMP_TH is greater than the comparison signal COMP, and in response, the comparison high signal COMP_H goes low.

When the third PWM signal PWM3 is high, the third phase is in the charging state, the current in an energy storage inductor of the third phase increases, and accordingly the value of the third CS signal CS3 increases. Also, when the third PWM signal PWM3 is high, the third CSR signal CSRAMP3 increases. In an embodiment, the third CSR signal CSRAMP3 increases at a rate proportional to an input voltage Vin. In another embodiment, the third CSR signal CSRAMP3 increases at a rate proportional to a voltage value of a switching node of the third phase.

Note that immediately after the time t6, all of the first to third PWM signals PWM1 to PWM3 are high, indicating that all of the first to third phases are in the charging state, and that respective currents are being provided to all of the inductors of the first to third phases.

A predetermined interval after the PWM start signal PWM_MLT went high at the time T6, the selected phase is rotated. The third phase select signal D3 goes low and the first phase select signal D1 goes high, indicating that the first phase is now the selected phase. Because the first phase select signal D1 is high indicating that the first phase is the selected phase, the mux output signal VI has a value corresponding to a value of the first CSR signal CSRAMP1. The comparison threshold signal COMP_TH then has a value equal to the sum of the common ramp signal RAMP0 and the mux output signal VI, which at this time corresponds to a sum of the values of the common ramp signal RAMP0 and the first CSR signal CSRAMP1.

At a time t7, a value of the first CSR signal CSRAMP1 exceeds a value of the comparison signal COMP, and in response the first PWM signal PWM1 goes low. When the first PWM signal PWM1 is low, the first phase is in the discharging state, the current in the energy storage inductor of the first phase decreases and the value of the first CS signal CS1 decreases accordingly, and the first CSR signal CSRAMP1 is decreased until it equals a value proportional to the value of the first CS signal CS1.

At a time t8, a value of the second CSR signal CSRAMP2 exceeds a value of the comparison signal COMP, and in response the second PWM signal PWM2 goes low. When the second PWM signal PWM2 is low, the second phase is in the discharging state, the current in the energy storage inductor of the second phase decreases and the value of the second CS signal CS2 decreases accordingly, and the second CSR signal CSRAMP2 is decreased until it equals a value proportional to the value of the second CS signal CS2.

At a time t9, the comparison threshold signal COMP_TH acquires a value less than the comparison signal COMP, and as a result the comparison high signal COMP_H goes high.

In response to the comparison high signal COMP_H having the high value, the PWM signal of the selected phase goes high. At the time t9, the first phase select signal D1 is high, indicating that the first phase is the selected phase, so the first PWM signal PWM1 goes high.

In response to the first PWM signal PWM1 going high, the PWM start signal PWM_MLT pulses to a high value. In response to the PWM start signal PWM_MLT pulsing to the high value, the common ramp signal RAMP0 is reset to the predetermined value. Once the common ramp signal RAMP0 is reset to the predetermined value, the comparison threshold signal COMP_TH is greater than the comparison signal COMP, and in response, the comparison high signal COMP_H goes low.

When the first PWM signal PWM1 is high, the first phase is in the charging state, the current in the energy storage inductor of the first phase increases, and accordingly the value of the first CS signal CS1 increases. Also, when the first PWM signal PWM1 is high, the first CSR signal CSRAMP1 increases.

A predetermined interval after the PWM start signal PWM_MLT went high at the time T9, the selected phase is rotated. The first phase select signal D1 goes low and the second phase select signal D2 goes high, indicating that the second phase is now the selected phase. Because the second phase select signal D2 is high indicating that the first phase is the selected phase, the mux output signal VI has a value corresponding to a value of the second CSR signal CSRAMP2. The comparison threshold signal COMP_TH has a value equal to the sum of the common ramp signal RAMP0 and the mux output signal VI, which at this time corresponds to a sum of the values of the common ramp signal RAMP0 and the second CSR signal CSRAMP2.

At a time t10, a value of the third CSR signal CSRAMP3 exceeds a value of the comparison signal COMP, and in response the third PWM signal PWM3 goes low. When the third PWM signal PWM3 is low, the third phase is in the discharging state, the current in the energy storage inductor of the third phase decreases and the value of the third CS signal CS3 decreases accordingly, and the third CSR signal CSRAMP3 is decreased until it equals a value proportional to the value of the third CS signal CS3.

At a time t11, a value of the first CSR signal CSRAMP1 exceeds a value of the comparison signal COMP, and in response the first PWM signal PWM1 goes low. When the first PWM signal PWM1 is low, the first phase is in the discharging state, the current in the energy storage inductor of the first phase decreases and the value of the first CS signal CS1 decreases accordingly, and the first CSR signal CSRAMP1 is decreased until it equals a value proportional to the value of the first CS signal CS1.

Note that immediately after the time t11, all of the first to third PWM signals PWM1 to PWM3 are low, indicating that all of the first to third phases are in the discharging state.

At a time t12, the comparison threshold signal COMP_TH acquires a value less than the comparison signal COMP, and as a result the comparison high signal COMP_H goes high.

In response to the comparison high signal COMP_H having the high value, because the second phase select signal D2 is high, indicating that the second phase is the selected phase, the second PWM signal PWM2 goes high.

In response to the second PWM signal PWM2 going high, the PWM start signal PWM_MLT pulses to a high value. In response to the PWM start signal PWM_MLT pulsing to the high value, the common ramp signal RAMP0 is reset to the predetermined value. Once the common ramp signal RAMP0 is reset to the predetermined value, the comparison threshold signal COMP_TH is greater than the comparison signal COMP, and in response, the comparison high signal COMP_H goes low.

When the second PWM signal PWM2 is high, the second phase is in the charging state, the current in an energy storage inductor of the second phase increases, and accordingly the value of the second CS signal CS2 increases. Also, when the second PWM signal PWM2 is high, the second CSR signal CSRAMP2 increases.

A predetermined interval after the PWM start signal PWM_MLT went high at the time T12, the selected phase is rotated. The second phase select signal D2 goes low and the third phase select signal D3 goes high, indicating that the third phase is now the selected phase. Because the third phase select signal D3 is high indicating that the third phase is the selected phase, the mux output signal VI has a value corresponding to a value of the third CSR signal CSRAMP3. The comparison threshold signal COMP_TH at this time corresponds to a sum of the values of the common ramp signal RAMP0 and the third CSR signal CSRAMP3.

At a time t13, a value of the second CSR signal CSRAMP2 exceeds a value of the comparison signal COMP, and in response the second PWM signal PWM2 goes low. When the second PWM signal PWM2 is low, the second phase is in the discharging state, the current in the energy storage inductor of the second phase decreases and the value of the second CS signal CS2 decreases accordingly, and the second CSR signal CSRAMP2 is decreased until it equals a value proportional to the value of the second CS signal CS2.

At a time t14, the comparison threshold signal COMP_TH acquires a value less than the comparison signal COMP, and as a result the comparison high signal COMP_H goes high.

In response to the comparison high signal COMP_H having the high value, because the third phase select signal D3 is high, indicating that the third phase is the selected phase, the third PWM signal PWM3 goes high.

In response to the third PWM signal PWM3 going high, the PWM start signal PWM_MLT pulses to a high value. In response to the PWM start signal PWM_MLT pulsing to the high value, the common ramp signal RAMP0 is reset to the predetermined value. Once the common ramp signal RAMP0 is reset to the predetermined value, the comparison threshold signal COMP_TH is greater than the comparison signal COMP, and in response, the comparison high signal COMP_H goes low.

When the third PWM signal PWM3 is high, the third phase is in the charging state, the current in an energy storage inductor of the third phase increases, and accordingly the value of the third CS signal CS3 increases. Also, when the third PWM signal PWM3 is high, the third CSR signal CSRAMP3 increases.

A predetermined interval after the PWM start signal PWM_MLT went high at the time T14, the selected phase is rotated. The third phase select signal D3 goes low and the first phase select signal D1 goes high, indicating that the first phase is now the selected phase. Because the first phase select signal D1 is high indicating that the first phase is the selected phase, the mux output signal VI has a value corresponding to a value of the first CSR signal CSRAMP1. The comparison threshold signal COMP_TH then has a value equal to the sum of the common ramp signal RAMP0 and the mux output signal VI, which at this time corresponds to a sum of the values of the common ramp signal RAMP0 and the first CSR signal CSRAMP1.

As shown in FIG. 6, in response to a step-up load transient of the load current iLoad, which discharges an output capacitor such as output capacitor 116 of FIG. 1, a voltage undershoot occurs in the output voltage Vout. As a result, the value of the comparison signal COMP increases rapidly and triggers multiple (and in this case, overlapping) PWM pulses at the times t4, t5, and t6. The high frequency, wide, and overlapping PWM pulses increase the respective currents in inductors of the respective phases quickly to provide sufficient total current to supply the load.

At the time t10, the total inductor currents of the three phases (as indicated by the current sense signals CS1, CS2, and CS3) becomes equal to or greater that the load current iLoad and excessive inductor currents starts to charge up the output capacitor 116 gradually. After a time t14, the output voltage Vout recovers to the regulation target and the converter reaches a new steady state in a high load condition.

Embodiments advantageously allow a plurality of phases to respond to a sudden increase in a load current with overlapping PSM pulses. Embodiments provide good phase alignment, as shown in FIG. 6, wherein PWM pulses of the phases are distributed in time in a relatively equal manner. Embodiments permit operation with an output voltage Vout greater or equal to an input voltage Vin divided by a number of phases N, that is, with Vout≥Vin/N, such as in, for example, battery-operated devices having a low input voltage Vin.

Figure 7:
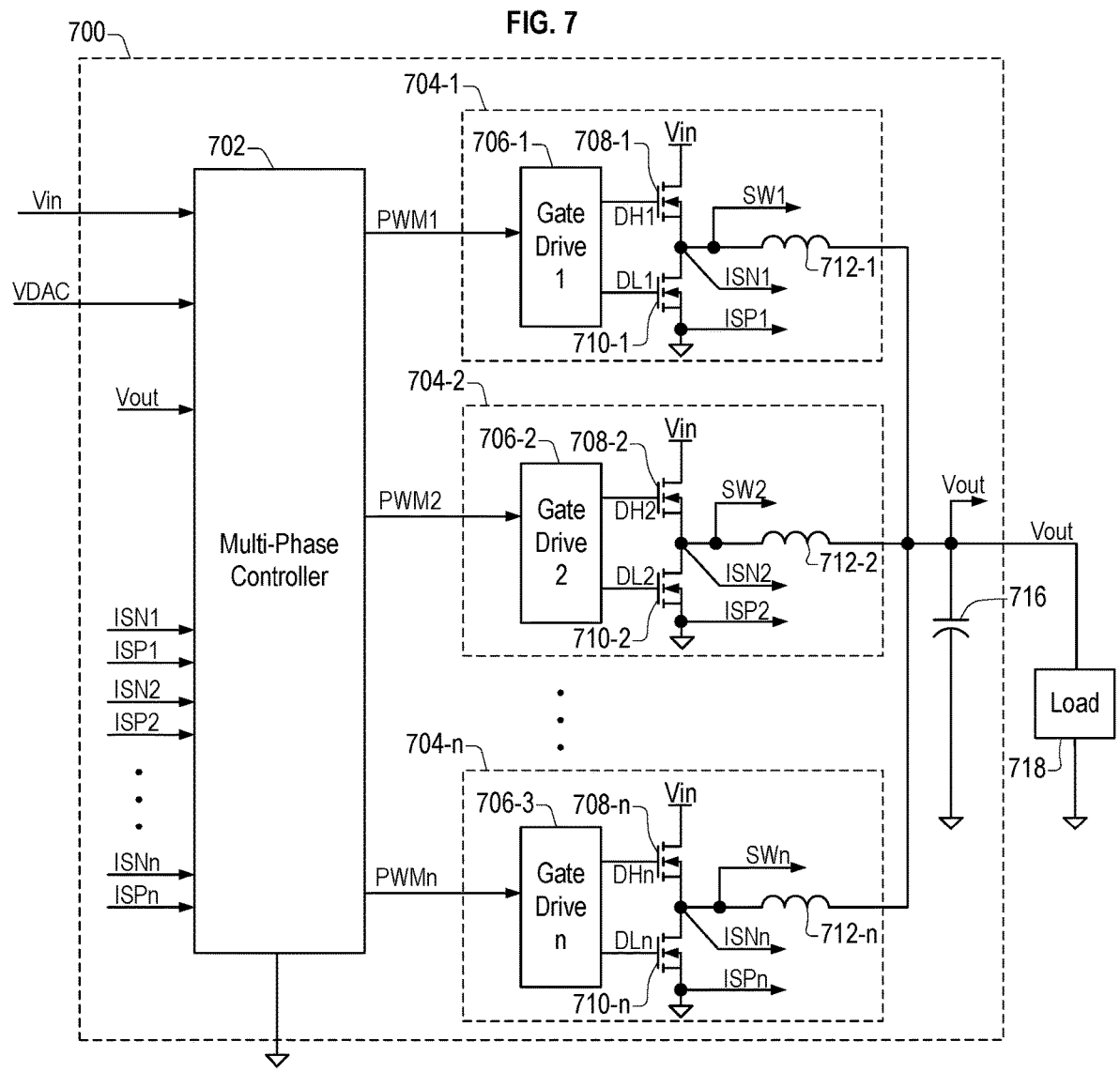
FIG. 7 illustrates a multi-phase voltage regulator circuit according to another embodiment.

FIG. 7 illustrates a multi-phase voltage regulator (VR) circuit 700 (hereinafter, the VR circuit 700) according to another embodiment. The VR circuit 700 receives an input voltage Vin and a reference voltage VDAC and a supplies an output voltage Vout to a load 718.

The VR circuit 700 includes a multi-phase controller 702 (hereinafter, the controller 702), a plurality of phase circuits 704-1 to 704-$n$, and an output capacitor 716. The controller 702 operates to produce the output voltage Vout by controlling the first to $n^{th}$ phase circuits 704-1 to 704-$n$ to provide respective currents to the output capacitor 716.

In particular, the controller 702 generates first to $n^{th}$ Pulse Width Modulation (PWM) signals PWM1 to PWMn that control the operation of the first to $n^{th}$ phase circuits 704-1 to 704-$n$. The controller 702 generates the first to $n^{th}$ PWM signals PWM1 to PWMn according to values of the reference voltage VDAC, the output voltage Vout, first to $n^{th}$ positive current sense signal ISP1 to ISPn and first to $n^{th}$ negative current sense signal ISN1 to ISNn.

The first phase circuit 704-1 includes a first gate drive circuit 706-1, a first high drive transistor 708-1, a first low drive transistor 710-1, and first inductor 712-1. In an embodiment, the first high drive transistor 708-1 and the first low drive transistor 710-1 are FETs. In an embodiment, the first high drive transistor 708-1 and the first low drive transistor 710-1 are n-channel MOSFETs (n-MOSFETs).

The first gate drive circuit 706-1 generates a first drive high signal DH1 and a first drive low signal DL1 according to a value of the first PWM signal PWM1. The first drive high signal DH1 and a first drive low signal DL1 are respectively connected to control terminals (e.g., gates) of the first high drive transistor 708-1 and first low drive transistor 710-1, respectively.

In an embodiment, when the first PWM signal PWM1 has a high value, the first gate drive circuit 706-1 generates a first drive high signal DH1 to turn the first high drive transistor 708-1 on and a first drive low signal DL1 to turn the first low drive transistor 710-1 off. When the first PWM signal PWM1 has a low value, the first gate drive circuit 706-1 generates a first drive high signal DH1 to turn the first high drive transistor 708-1 off and a first drive low signal DL1 to turn the first low drive transistor 710-1 on.

A first conduction terminal (e.g. a drain) of the first high drive transistor 708-1 is connected to the input voltage Vin. A second conduction terminal (e.g. a source) of the first high drive transistor 708-1 is coupled to a first end of a first inductor 712-1. A second end of the first inductor 712-1 is connected to the output capacitor 716.

A first conduction terminal (e.g. a drain) of the first low drive transistor 710-1 is also coupled to the first end of the first inductor 712-1. A second conduction terminal (e.g. a source) of the first low drive transistor 710-1 is connected to ground.

A first switching node signal SW1 is generated at the first end of the first inductor 712-1. A first negative current sense signal ISN1 is generated at the first conduction terminal of the first low drive transistor 710-1. A first positive current sense signal ISP1 is generated at the second conduction terminal of the first low drive transistor 710-1.

When the first PWM signal PWM1 has the high value, the first high drive transistor 708-1 is on, the first low drive transistor 710-1 is off, current may flow from the input voltage Vin to the output capacitor 716 and the load 718, and energy is stored in a magnetic field of the first inductor 712-1. When the first PWM signal PWM1 has the low value, the first high drive transistor 708-1 is off, and the first low drive transistor 710-1 is on, and the energy stored in the magnetic field of the first inductor 712-1 may be transferred to the output capacitor 716 and the load 718. When the first PWM signal PWM1 has the low value, a current through the first inductor 712-1 may be determined according to a difference between values of first positive current sense signal ISP1 and the first negative current sense signal ISN1.

The second phase circuit 704-2 includes a second gate drive circuit 706-2, a second high drive transistor 708-2, a second low drive transistor 710-2, and a second inductor 712-2. The second phase circuit 704-2 receives the second PWM signal PWM2 and generates a second positive current sense signal ISP2, and a second negative current sense signal ISN2.

The second phase circuit 704-2 is configured similarly to the first phase circuit 704-1. The second phase circuit 704-2 operates in the manner described for first phase circuit 704-1. A second switching node signal SW2 is generated at a first end of the second inductor 712-2. The second positive current sense signal ISP2 and second negative current sense signal ISN2 are generated at second and first conduction terminals of the second low drive transistor 710-2, respectively.

The $n^{th}$ phase circuit 704-$n$ includes an $n^{th}$ gate drive circuit 706-$n$, an $n^{th}$ high drive transistor 708-$n$, an $n^{th}$ low drive transistor 710-$n$, and an $n^{th}$ inductor 712-$n$. The $n^{th}$ phase circuit 704-2 receives the $n^{th}$ PWM signal PWMn and generates an $n^{th}$ positive current sense signal ISPn, and an $n^{th}$ negative current sense signal ISNn.

The $n^{th}$ phase circuit 704-$n$ is configured similarly to the first phase circuit 704-1. The $n^{th}$ phase circuit 704-$n$ operates in the manner described for first phase circuit 704-1. An $n^{th}$ switching node signal SWn is generated at a first end of the $n^{th}$ inductor 712-$n$. The $n^{th}$ positive current sense signal ISPn and $n^{th}$ negative current sense signal ISNn are generated at second and first conduction terminals of the $n^{th}$ low drive transistor 710-$n$, respectively.

In an embodiment, each of the first to $n^{th}$ gate drive circuits 706-1 to 706-$n$ operates to introduce a dead time between assertions of the respective high drive signal and low drive signal. That is, each of the first to $n^{th}$ gate drive circuits 706-1 to 706-$n$ operates so that a first dead time elapses after the respective high drive transistor is turned off before the respective low drive transistor is turned on, and a second dead time elapses after the respective low drive transistor is turned off before the respective high drive transistor is turned on.

In an embodiment, the controller 702 further receives the first to $n^{th}$ switching node voltages SW1 to SWn and uses the first to $n^{th}$ switching node voltages SW1 to SWn to generate the first to $n^{th}$ PWM signals PWM1 to PWMn.

Figure 8:
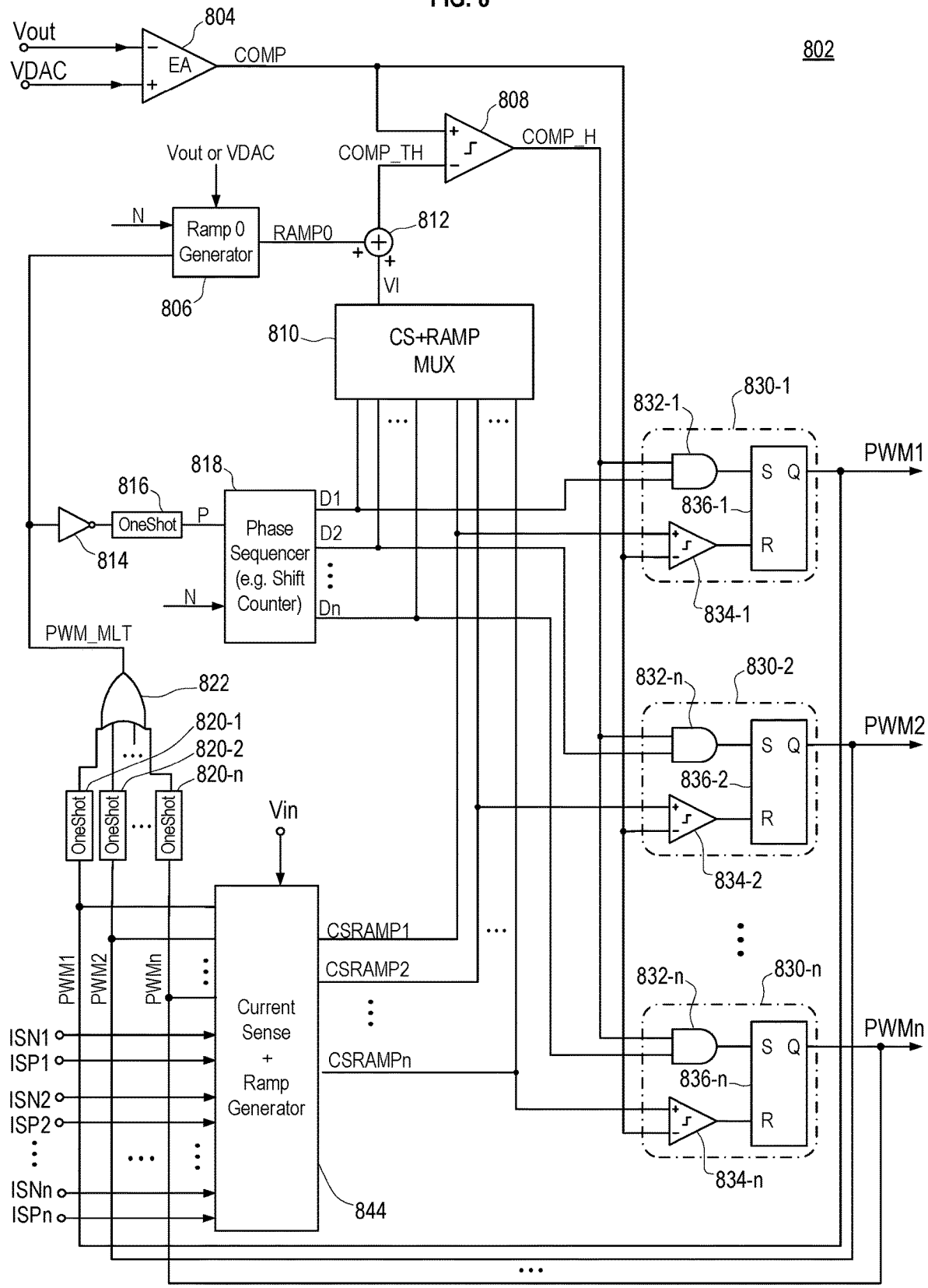
FIG. 8 illustrates a multi-phase controller circuit according to another embodiment.

FIG. 8 illustrates a multi-phase controller circuit 802 (hereinafter, controller 802), according to an embodiment. The controller 802 is suitable for use in the multi-phase controller 702 of the multi-phase voltage regulator circuit 700 of FIG. 7.

The controller 802 receives an input voltage Vin, an output voltage Vout, a reference voltage VDAC, first to $n^{th}$ positive current sense signals ISP1 to ISPn, and first to $n^{th}$ negative current sense signals ISN1 to ISNn. The controller 802 may also receive a number of phases signal N indicating a number of phases to control. The controller 202 generates first to n$^{th}$ Pulse Width Modulation (PWM) signals PWM1 to PWMn according to the received signals.

Elements of the controller 802 correspond to similarly-numbered elements of the controller 202 of FIG. 2 and function analogously. For example, an Error Amplifier (EA) 804 of FIG. 8 corresponds to the EA 204 of FIG. 2, a ramp-0 generator circuit 806 of FIG. 8 corresponds to the ramp-0 generator circuit 206 of FIG. 2, and so on. Signals in FIG. 8 correspond to like-named signals in FIG. 2.

The controller 802 differs from the controller 202 of FIG. 2 in that a CSR signal generator 844 is used instead of the CSR signal generator 224. The CSR signal generator 844 receives the first to n$^{th}$ positive current sense signals ISP1 to ISPn, and the first to n$^{th}$ negative current sense signals ISN1 to ISNn instead of the first to n$^{th}$ current sense (CS) signals CS1 to CSn received by the CSR signal generator 224 of FIG. 2. Operation of the CSR signal generator 844 is described with respect to the embodiments shown in FIGS. 9A and 9B, below.

Figure 9A:
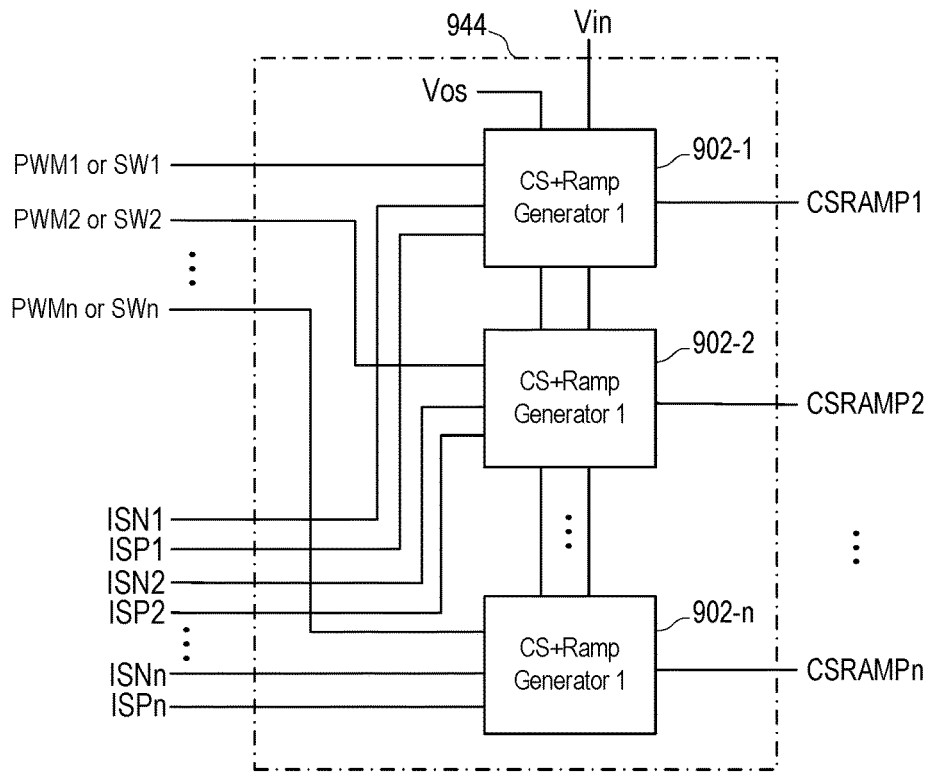
FIG. 9A illustrates a CSR signal generator according to an embodiment.

FIG. 9A illustrates a CSR signal generator 944 according to an embodiment. The CSR signal generator 944 is suitable for use in the CSR signal generator 844 of FIG. 8. The CSR signal generator 944 includes first to n$^{th}$ CSR generator circuits 902-1 to 902-n.

The CSR signal generator 944 receives the input voltage Vin and supplies it to the first to n$^{th}$ CSR generator circuits 902-1 to 902-n. The CSR signal generator 944 either receives or internally generates an offset voltage Vos and supplies it to the first to n$^{th}$ CSR generator circuits 902-1 to 902-n. The CSR signal generator 944 receives first to n$^{th}$ positive current sense signals ISP1 to ISPn and supplies them to the first to n$^{th}$ CSR generator circuits 902-1 to 902-n, respectively. The CSR signal generator 944 also receives first to n$^{th}$ negative current sense signals ISN1 to ISNn and supplies them to the first to n$^{th}$ CSR generator circuits 902-1 to 902-n, respectively.

In an embodiment, the CSR signal generator 944 receives first to n$^{th}$ PWM signals PWM1 to PWMn and provides them to the first to n$^{th}$ CSR generator circuits 902-1 to 902-n, respectively.

In another embodiment, the CSR signal generator 944 receives first to n$^{th}$ switching node voltages SW1 to SWn and provides them to the first to n$^{th}$ CSR generator circuits 902-1 to 902-n, respectively.

The first to n$^{th}$ CSR generator circuits 902-1 to 902-n respectively generate first to n$^{th}$ CSR signals CSRAMP1 to CSRAMPn in the manner described for the CSR generator circuit 902-k of FIG. 9B, below.

Figure 9B:
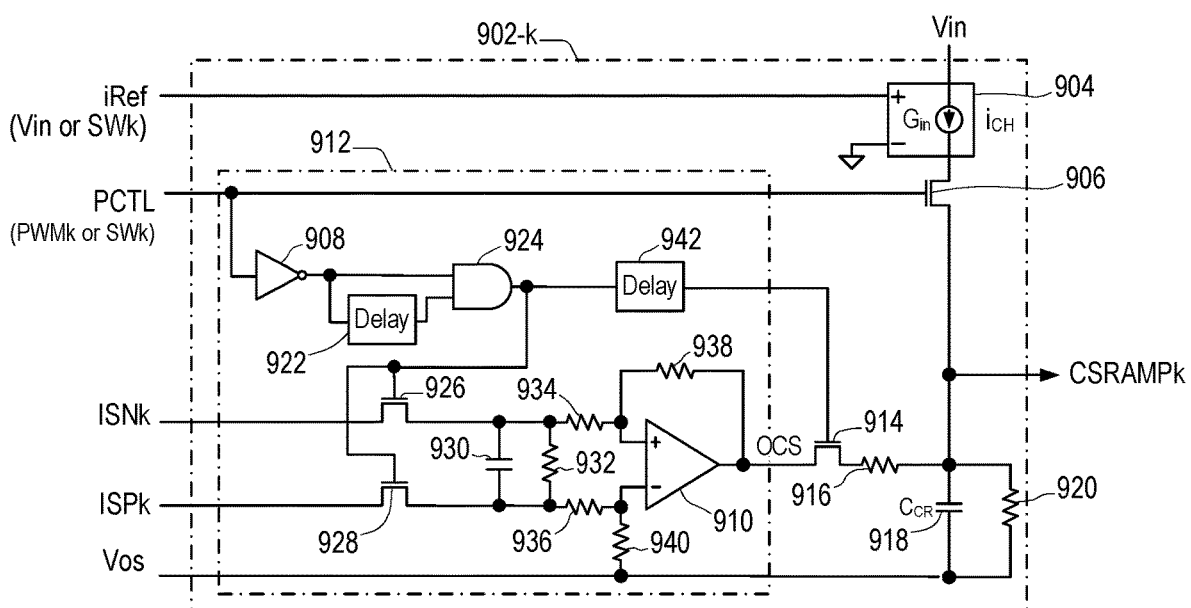
FIG. 9B illustrates a CSR generator circuit according to an embodiment.

FIG. 9B illustrates a CSR generator circuit 902-k according to an embodiment. The CSR generator circuit 902-k is suitable for use in any or all of the first to n$^{th}$ CSR generator circuits 902-1 to 902-n of FIG. 9A.

The CSR generator circuit 902-k receives an input voltage Vin, an offset voltage Vos, a current reference signal iRef, a phase control signal PCTL, a positive current sense signal ISPk, and a negative current sense signal ISNk. The current sense signals ISPk and ISNk are differential current sense signals of a k$^{th}$ phase.

In an embodiment, the current reference signal iRef is the input voltage Vin.

In an embodiment, the current reference signal iRef is the a k$^{th}$ phase switching node voltage SWk, in order to provide good adaptive pulse width control of a k$^{th}$ phase PWM signal.

In an embodiment, the phase control signal PCTL is a k$^{th}$ phase PWM signal PWMk.

In an embodiment, the phase control signal PCTL is the k$^{th}$ phase switching node voltage SWk.

The CSR generator circuit 902-k produces a CSR signal CSRAMPk according to the received signals. In an embodiment, the CSR signal CSRAMPk is a k$^{th}$ phase CSR signal.

When the phase control signal PCTL has a low value, the CSR generator circuit 902-k produces the CSR signal CSRAMPk having a value equal to a sum of a value of the offset voltage Vos and a voltage proportional to a difference between the positive current sense signal ISPk and negative current sense signal ISNk. When the phase control signal PCTL has a high value, the CSR generator circuit 902-k increases the value of the CSR signal CSRAMPk at a rate proportional to a value of the current reference signal iRef.

The phase control signal PCTL having the low value may indicate that a phase is in a discharging state. The phase control signal PCTL having the high value may indicate that a phase is in a charging state.

The CSR generator circuit 902-k includes a current source 904, a first transistor 906, an Offset Current Sense (OCS) circuit 912, a second transistor 914, and an output capacitor 918. In some embodiments, the CSR generator circuit 902-k further includes a first resistor 916, a second resistor 920, or both.

The OCS circuit 912 generates an offset plus CS signal OCS using a value of the offset voltage Vos and a difference in values of the positive current sense signal ISPk and negative current sense signal ISNk. The OCS circuit 912 includes an amplifier 910, first and second sampling transistors 926 and 928, a sampling capacitor 930, and third to seventh resistors 932 to 940.

The OCS circuit 912 further includes a control signal chain including an inverter 908, first and second delay circuits 922 and 942, and first and second AND gates 924 and 944. The inverter 908 receives the phase control signal PCTL and provides an inverted version thereof to a first input of the AND gate 924 and to an input of the first delay circuit 922. The first delay circuit 922 provides, to a second input of the first AND gate 924, an output signal corresponding to a delayed version of the inverted version of the phase control signal PCTL.

An output of the first AND gate 924 therefore produces an output signal that goes low as an immediate response to the phase control signal PCTL going high, and that goes high as a delayed response to the phase control signal PCTL going low. The delay in the output of the first AND gate 924 going high corresponds to a delay of the first delay circuit 922.

The output of the first AND gate 924 is connected to a first input of the second AND gate 944 and to an input of the second delay circuit 942. The second delay circuit 942 provides, to a second input of the second AND gate 944, an output signal corresponding to a delayed version of the output of the first AND gate 924.

An output of the second AND gate 944 therefore produces an output signal that goes low as an immediate response to the output of the first AND gate 924 going low, and that goes high as a delayed response to the output of the first AND gate 924 going high. The delay in the output of the second AND gate 944 going high corresponds to a delay of the second delay circuit 942.

In an embodiment, the first delay circuit 922 and the second delay circuit 942 are each implemented using an even number of inverters connected in series, but embodiments are not limited thereto.

The output of the first AND gate 924 is also connected to control gates of the first and second sampling transistors 926 and 928. When the output of the first AND gate 924 goes high, the first and second sampling transistors 926 and 928 are turned on, coupling the positive current sense signal ISPk and negative current sense signal ISNk to first and second terminals of the sampling capacitor 930, respectively, thus sampling the values of the current sense signals ISNk and INPk. Delaying the output of the first AND gate 924 going high prevents sampling of switching noise on the current sense signals ISPk and ISNk that occurs as a result of the phase control signal PCTL going low.

The third resistor 932 operates to drain a charge off of the sampling capacitor 930 when the first and second sampling transistors 926 and 928 are off—that is, then the output of the first AND gate 924 is low. In an embodiment, the third resistor 932 has a resistance of around 1 MOhm.

The fourth to seventh resistors 934 to 940 and the amplifier 910 form a differential amplifier that operates to amplify a difference between voltage values of the first and second terminals of the sampling capacitor 930, respectively.

In an embodiment, respective resistances of the fourth and fifth resistors 934 and 936 are equal, and respective resistances of the sixth and seventh resistors 938 and 940 are equal.

In an illustrative embodiment, resistances of the fourth to seventh resistors 934 to 940 are 100K ohms, 100K ohms, 500K ohms, and 500K ohms, respectively.

An output of the amplifier 910 produces the offset plus CS signal OCS. A first conduction terminal of the second transistor 914 receives the offset plus CS signal OCS. A control terminal (such as a gate) of the second transistor 914 receives a delayed version of the output of the first AND gate 924 produced by the second delay circuit 942 and the second AND gate 944. The delay introduced by the second delay circuit 942 allows the offset plus CS signal OCS time to settle.

The components of the CSR generator circuit 902-$k$ outside the OCS circuit 912 are connected together and operate analogously to their similarly-numbered counterparts in FIG. 5B: the current source 904 operates as described for the current source 504 of FIG. 5B, the first transistor 906 operates as described for the first transistor 506 of FIG. 5B, and so on.

In an embodiment wherein the CSR generator circuit 902-$k$ includes a first resistor 916, the first resistor 916 operate analogously to and has a value as described for the first resistor 516 of FIG. 5B. In an embodiment wherein the CSR generator circuit 902-$k$ includes a second resistor 920, the second resistor 920 operate analogously to and has a value as described for the second resistor 520 of FIG. 5B.

Figure 10A:
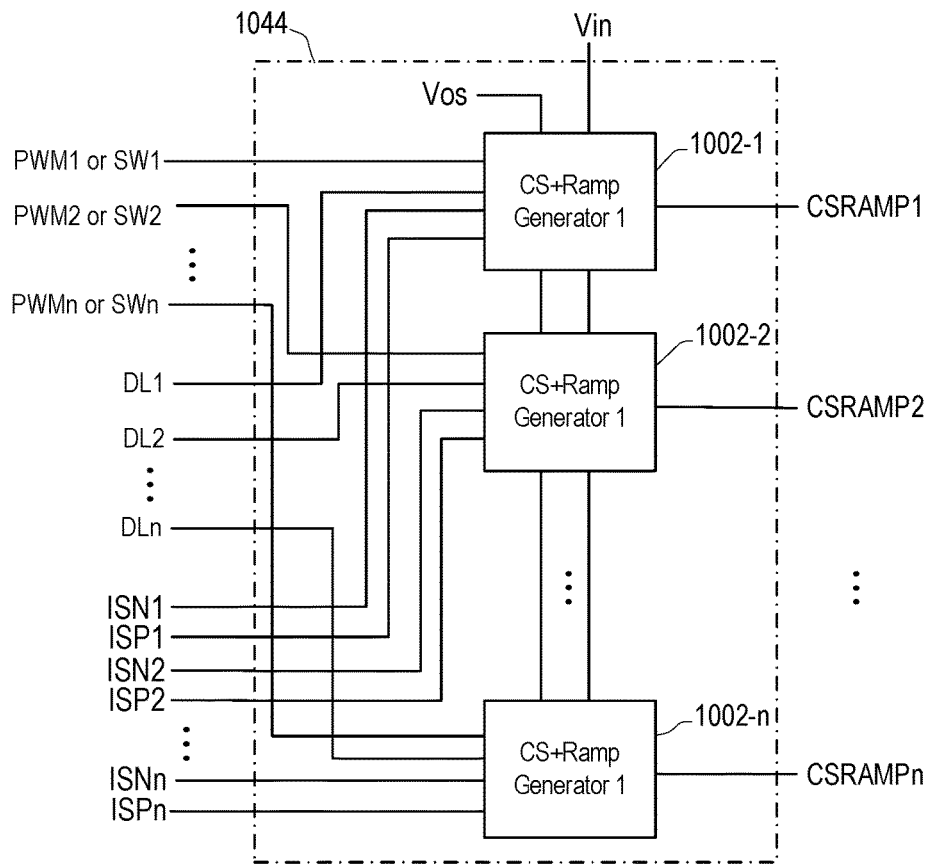
FIG. 10A illustrates a CSR signal generator according to another embodiment.

FIG. 10A illustrates a CSR signal generator 1044 according to an embodiment. The CSR signal generator 1044 is suitable for use in the CSR signal generator 844 of FIG. 8 when the first to $n^{th}$ side drive signals DL1 to DLn shown in FIG. 1 are also provided to the CSR signal low generator 844. The CSR signal generator 1044 includes first to $n^{th}$ CSR generator circuits 1002-1 to 1002-$n$.

The CSR signal generator 1044 receives the input voltage Vin and supplies it to the first to $n^{th}$ CSR generator circuits 1002-1 to 1002-$n$. The CSR signal generator 1044 either receives or internally generates an offset voltage Vos and supplies it to the first to $n^{th}$ CSR generator circuits 1002-1 to 1002-$n$. The CSR signal generator 1044 receives first to $n^{th}$ positive current sense signals ISP1 to ISPn and supplies them to the first to $n^{th}$ CSR generator circuits 1002-1 to 1002-$n$, respectively. The CSR signal generator 1044 also receives first to $n^{th}$ negative current sense signals ISN1 to ISNn and supplies them to the first to $n^{th}$ CSR generator circuits 1002-1 to 1002-$n$, respectively.

The CSR signal generator 1044 also receives the first to $n^{th}$ low side drive signals DL1 to DLn and supplies them to the first to $n^{th}$ CSR generator circuits 1002-1 to 1002-$n$, respectively.

In an embodiment, the CSR signal generator 1044 receives first to $n^{th}$ PWM signals PWM1 to PWMn and provides them to the first to $n^{th}$ CSR generator circuits 1002-1 to 1002-$n$, respectively.

In another embodiment, the CSR signal generator 1044 receives first to $n^{th}$ switching node voltages SW1 to SWn and provides them to the first to $n^{th}$ CSR generator circuits 1002-1 to 1002-$n$, respectively.

Figure 10B:
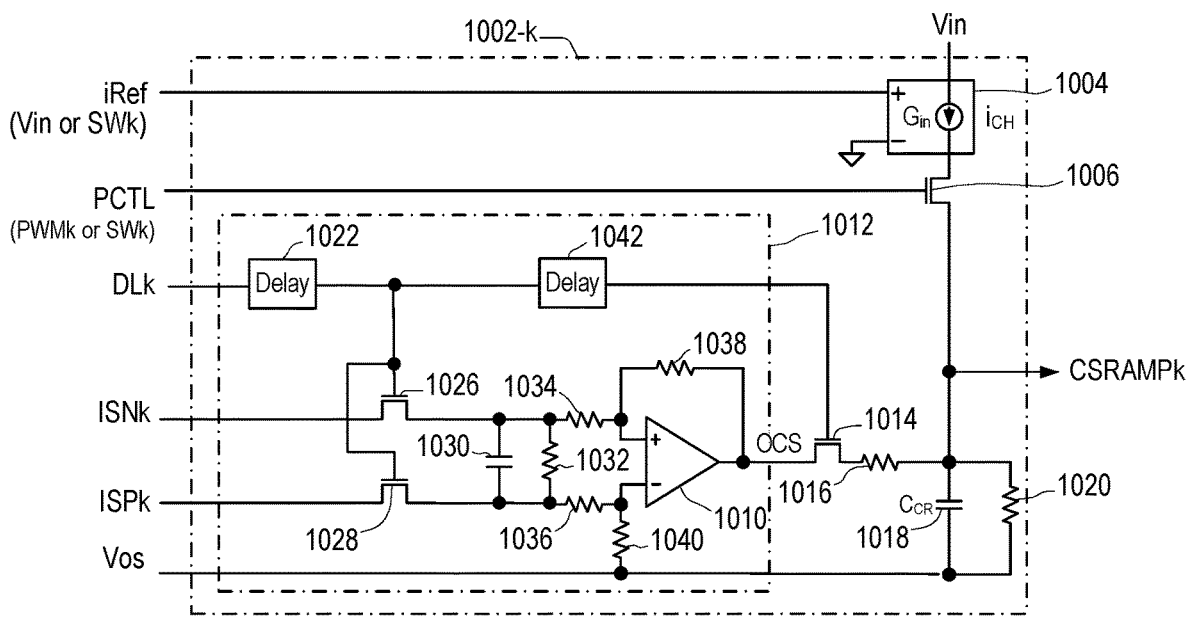
FIG. 10B illustrates a CSR generator circuit according to another embodiment.

The first to $n^{th}$ CSR generator circuits 1002-1 to 1002-$n$ respectively generate first to $n^{th}$ CSR signals CSRAMP1 to CSRAMPn in the manner described for the CSR generator circuit 1002-$k$ of FIG. 10B.

FIG. 10B illustrates a CSR generator circuit 1002-$k$ according to an embodiment. The CSR generator circuit 1002-$k$ is suitable for use in any or all of the first to $n^{th}$ CSR generator circuits 1002-1 to 1002-$n$ of FIG. 10A.

The CSR generator circuit 1002-$k$ receives an input voltage Vin, an offset voltage Vos, a current reference signal iRef, a phase control signal PCTL, a positive current sense signal ISPk, a negative current sense signal ISNk, and a low side drive signals DLk. The current sense signals ISPk and ISNk are differential current sense signals of a $k^{th}$ phase, and the low side drive signals DLk is a low side drive signal of a $k^{th}$ phase.

In an embodiment, the current reference signal iRef is the input voltage Vin.

In an embodiment, the current reference signal iRef is the a $k^{th}$ phase switching node voltage SWk, in order to provide good adaptive pulse width control of a $k^{th}$ phase PWM signal.

In an embodiment, the phase control signal PCTL is a $k^{th}$ phase PWM signal PWMk.

In an embodiment, the phase control signal PCTL is the $k^{th}$ phase switching node voltage SWk.

The CSR generator circuit 1002-$k$ produces a CSR signal CSRAMPk according to the received signals. In an embodiment, the CSR signal CSRAMPk is a $k^{th}$ phase CSR signal.

When the phase control signal PCTL has a low value, the CSR generator circuit 1002-$k$ produces the CSR signal CSRAMPk having a value equal to a sum of a value of the offset voltage Vos and a voltage proportional to a difference between the positive current sense signal ISPk and negative current sense signal ISNk. When the phase control signal PCTL has a low value, CSR generator circuit 902-$k$ increases the value of the CSR signal CSRAMPk at a rate proportional to a value of the current reference signal iRef.

The CSR generator circuit 1002-$k$ includes a current source 1004, a first transistor 1006, an Offset Current Sense (OCS) circuit 1012, a second transistor 1014, and an output capacitor 1018. In some embodiments, the CSR generator circuit 1002-$k$ further includes a first resistor 1016, a second resistor 1020, or both.

The current source 1004, first transistor 1006, second transistor 1014, output capacitor 1018, first resistor 1016 (if present), and second resistor 1020 (if present) are configured and operate analogously to the current source 904, first transistor 906, second transistor 914, output capacitor 918, first resistor 916, and second resistor 920 of FIG. 9B, respectively.

The OCS circuit 1012 generates an offset plus CS signal OCS corresponding to a differential value of the positive current sense signal ISPk and negative current sense signal ISPk summed with a value of the offset voltage Vos. The OCS circuit 1012 includes an amplifier 1010, first and second sampling transistors 1026 and 1028, a sampling capacitor 1030, and third to seventh resistors 1032 to 1040.

The OCS circuit 1012 differs from the OCS circuit 912 of FIG. 9B in that the control signal chain of OCS circuit 1012 operates using the low side drive signal DLk. The control signal chain of OCS circuit 1012 includes first and second delay circuits 1022 and 1042, and first and second AND gates 1024 and 1044.

The low side drive signal DLk is connected to a first input of the first AND gate 1024 and to an input of the first delay circuit 1022. The first delay circuit 1022 provides, to a second input of the first AND gate 1024, an output signal corresponding to a delayed version of the low side drive signal DLk.

An output of the first AND gate 1024 therefore produces an output signal that goes low as an immediate response to the low side drive signal DLk going low, and that goes high as a delayed response to the low side drive signal DLk going high. The delay in the output of the first AND gate 1024 going high corresponds to a delay of the first delay circuit 1022.

The output of the first AND gate 1024 is connected to a first input of the second AND gate 1044 and to an input of the second delay circuit 1042. The second delay circuit 1042 provides, to a second input of the second AND gate 1044, an output signal corresponding to a delayed version of the output of the first AND gate 1024.

An output of the second AND gate 1044 therefore produces an output signal that goes low as an immediate response to the output of the first AND gate 1024 going low, and that goes high as a delayed response to the output of the first AND gate 1024 going high. The delay in the output of the second AND gate 1044 going high corresponds to a delay of the second delay circuit 1042.

The first AND gate 1024 provides an output corresponding to a delayed version of the low side drive signal DLk to the first and second sampling transistors 1026 and 1028 and to the second delay circuit 1042. The output of the first AND gate 1024 performs the functions performed by the output of the first AND gate 924 of FIG. 9B. The output of the second AND gate 1044 performs the functions performed by the output of the second AND gate 944 of FIG. 9B.

Other than the difference described above between the OCS circuit 1012 and the OCS circuit 912 of FIG. 9B, the configuration and operation of the OCS circuit 1012 is analogous to that of the OCS circuit 912 of FIG. 9B, with components of the OCS circuit 1012 corresponding to similarly-numbered components in FIG. 9B.

Figure 11:
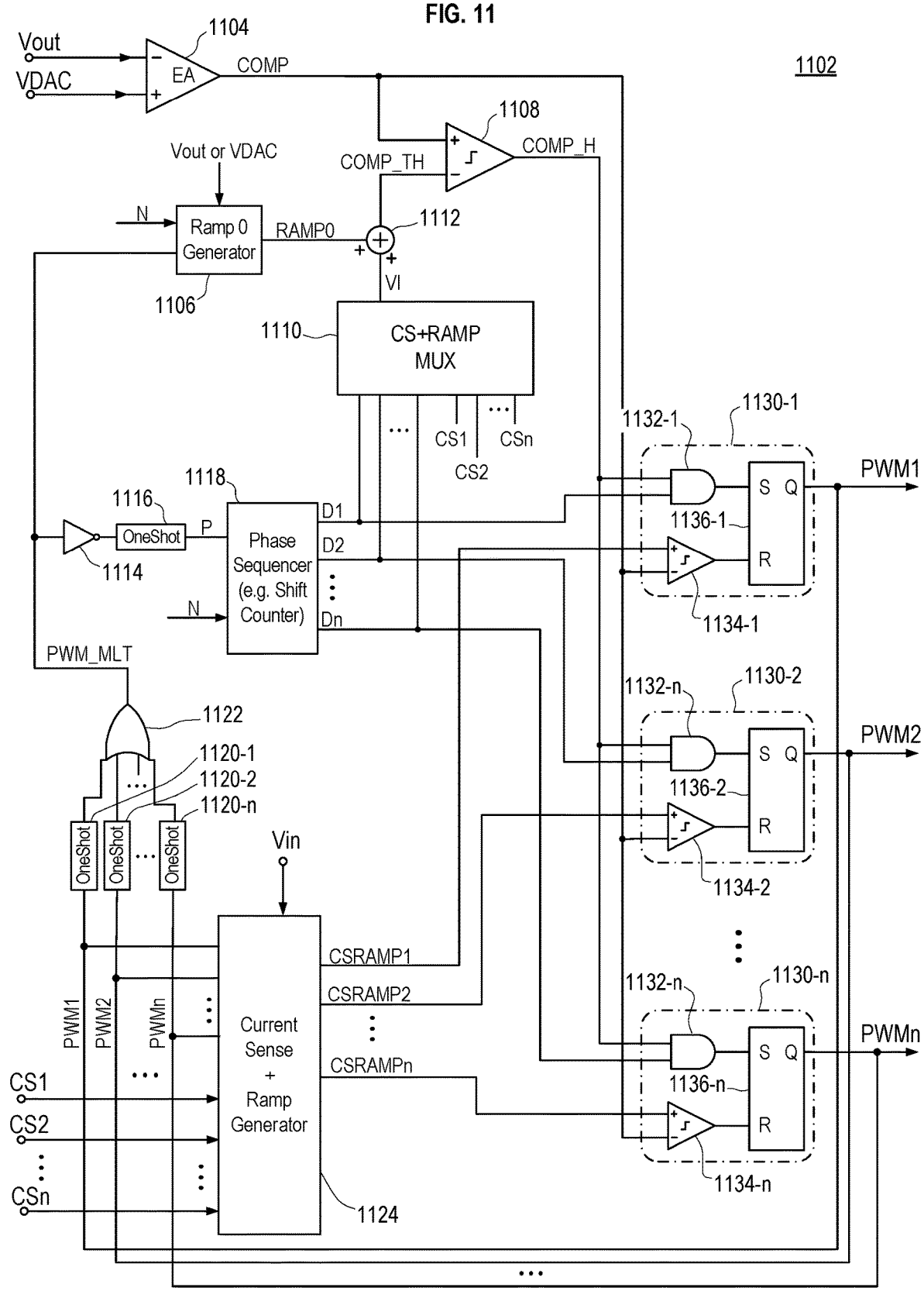
FIG. 11 illustrates a multi-phase controller circuit according to another embodiment.

FIG. 11 illustrates a multi-phase controller circuit 1102 (hereinafter, controller 1102), according to an embodiment. The controller 1102 is suitable for use as the multi-phase controller 102 of the multi-phase voltage regulator circuit 100 of FIG. 1.

The controller 1102 receives an input voltage Vin, an output voltage Vout, a reference voltage VDAC, and first to $n^{th}$ current sense (CS) signals CS1 to CSn. The controller 1102 may also receive a number of phases signal N indicating a number of phases to control. The controller 1102 generates first to $n^{th}$ Pulse Width Modulation (PWM) signals PWM1 to PWMn according to the received signals. In an embodiment, the number of PWM signals generated is equal to the value of the number of phases signal N.

The controller 1102 includes an Error Amplifier (EA) 1104, a ramp-0 generator circuit 1106, an error comparator 1108, and a current sense plus ramp (CSR) signal multiplexer 1110, and a summing circuit 1112. The controller 1102 further includes an inverter 1114, a common one-shot circuit 1116, a phase sequencer circuit 1118, first to $n^{th}$ phase one-shot circuits 1120-1 to 1120-n, and an OR gate 1122. The controller 1102 further includes a CSR signal generator 1124 and first to $n^{th}$ Pulse Width Modulation (PWM) control circuits 1130-1 to 1130-n.

The first PWM control circuit 1130-1 includes a first AND gate 1132-1, a first comparator 1134-1, and a first set-reset latch 1136-1. The second PWM control circuit 1130-2 includes a second AND gate 1132-2, a second comparator 1134-2, and a second set-reset latch 1136-2. The $n^{th}$ PWM control circuit 1130-n includes an $n^{th}$ AND gate 1132-n, an $n^{th}$ comparator 1134-n, and an $n^{th}$ set-reset latch 1136-n.

The controller 1102 is configured and operates similarly to the controller 202 of FIG. 2, except that the CSR signal multiplexer 1110 receives the first to $n^{th}$ CS signals CS1 to CSn instead of the first to $n^{th}$ CSR signals CSRAMP1 to CSRAMP2. Accordingly, the CSR signal multiplexer 1110 generates the mux output signal VI having a value equal to the first to $n^{th}$ CS signals CS1 to CSn having a respective first to $n^{th}$ phase select signals D1 to Dn having the active state.

Figure 12:
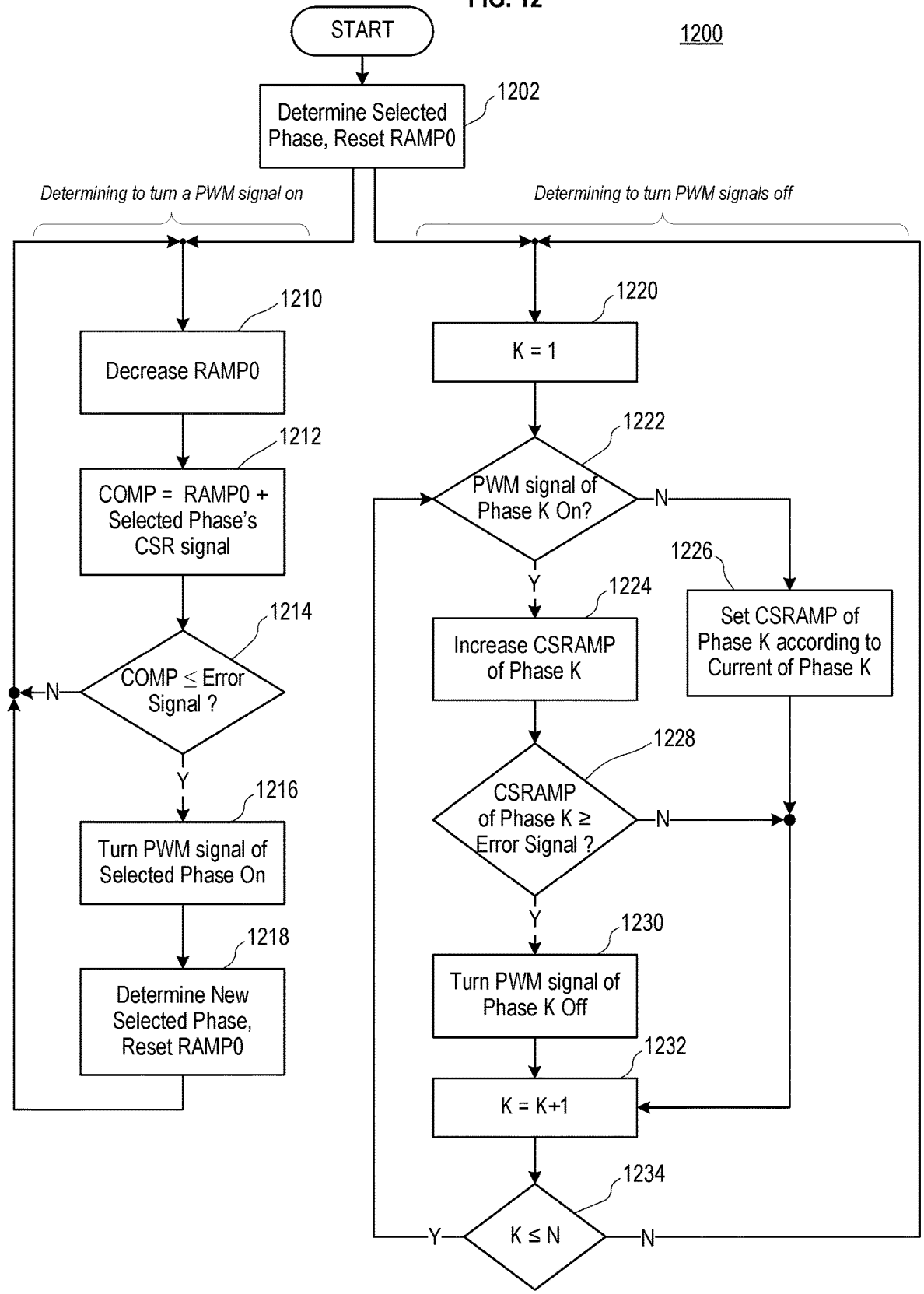
FIG. 12 illustrates a process for controlling Pulse Width Modulation (PWM) phases, according to an embodiment.

FIG. 12 illustrates a process 1200 for controlling Pulse Width Modulation (PWM), according to an embodiment. The process 1200 may be used in a multi-phase controller circuit such as the controller 202 of FIG. 2, the controller 802 of FIG. 8, or the controller 1102 of FIG. 11.

In an embodiment of the process 1200, operations of elements 1210 to 1218 may be performed in parallel (that is, at the same time) with operations of elements 1220 to 1234. Furthermore, for the loop having the index variable K shown in elements 1222 to 1234, wherein each iteration of the loop corresponds to controlling one of first to $N^{th}$ phases, each iteration of the loop may be performed in parallel with the other iterations.

In another embodiment of the process 1200, operations of the elements 1210 to 1218 may be performed sequentially or interleaved with operations of elements 1220 to 1234. Furthermore, for the loop having the index variable K in elements 1222 to 1234, wherein each iteration of the loop corresponds to a phase K, each iteration may be performed in sequence with the other iterations.

The operations of elements S1210 to S1218 operate to determine a selected phase and determine to turn on a PWM signal of the selected phase. The operations of elements S1220 to S1234 operate to determine to turn off the respective PWM signals of the first to $N^{th}$ phases.

At S1202, an initialization takes place wherein a phase of one or more phases is determined to be the selected phase, and a value of common ramp signal RAMP0 is reset to a reset value. In an embodiment, the reset value is determined using a reference voltage. In an embodiment, the reset value is determined using an output voltage of a voltage regulator circuit in which the process 1200 is being performed.

When the operations of S1202 are complete, the process 1200 proceeds to S1210, S1220, or both.

Regarding the left side of FIG. 12, at S1210, the value of the common ramp signal RAMP0 is decreased. In an embodiment, the value of the common ramp signal RAMP0 is decreased at a rate determined according to a reference voltage. In an embodiment, the value of the common ramp signal RAMP0 is decreased at a rate determined according to the output voltage.

At S1212, a comparison threshold signal COMP_TH is determined according to the value of the common ramp signal RAMP0 and a value of a Current Sense plus Ramp (CSR) Signal of the selected phase. In an embodiment, the comparison threshold signal COMP_TH is determined by summing the value of the common ramp signal RAMP0 and a value proportional to the value of the CSR Signal of the selected phase.

At S1214, the value of the comparison threshold signal COMP_TH is compared to a value of an error signal. In an embodiment, the value of the error signal is proportional to an error between the output voltage and the reference voltage. At S1214, the process 1200 proceeds to S1216 when the value of the comparison threshold signal COMP_TH is less than or equal to the value of the error signal, and proceeds to S1210 when the value of the comparison threshold signal COMP_TH is greater than the value of the error signal.

At S1216, a PWM signal of the selected phase is turned on.

At S1218, a new phase is determined to be the selected phase. In an embodiment having N phases numbered 1 to N, a phase x+1 is determined to be the selected phase when the selected phase is phase x and x<N, and a phase 1 is determined to be the selected phase when the selected phase is phase N. Furthermore, at S1218 the common ramp signal RAMP0 is reset to the reset value, as described above for S1202. The process 1200 then proceeds to S1210.

Regarding the right side of FIG. 12, At S1220, a loop index K is initialized to 1.

At S1222, the process 1200 proceeds to S1224 when a PWM signal of phase K is on, and proceeds to S1226 when a PWM signal of phase K is off.

At S1224, a value of a CSR Signal of phase K is increased. In an embodiment, the value of the CSR signal CSRAMPk is increased at a rate determined according to an input voltage of the voltage regulator circuit in which the process 1200 is being performed. In another embodiment, the value of the CSR signal CSRAMPk is increased at a rate determined according to voltage at a switching node of phase K.

At S1226, the value of the CSR Signal CSRAMP of phase K is set according to a current of phase K. In an embodiment, the current is an inductor current. In an embodiment, the current is a current through a Field Effect Transistor (FET), such as a Metal Oxide Semiconductor FET.

At S1228, the value of the CSR Signal CSRAMP is compared to the value of the error signal. At S1228, the process 1200 proceeds to S1230 when the value of the CSR Signal CSRAMP is greater than or equal to the value of the error signal, and proceeds to S1232 when the value of the CSR Signal CSRAMP is less than the value of the error signal.

At S1230, a PWM signal of phase K is turned off.

At S1232, the loop index K is increased by one.

At 1234, the process 1200 proceeds to S1222 when the loop index K is less than or equal to the number of phases N, and proceeds to S1220 when the loop index K is greater than the number of phases N.

Figure 13:
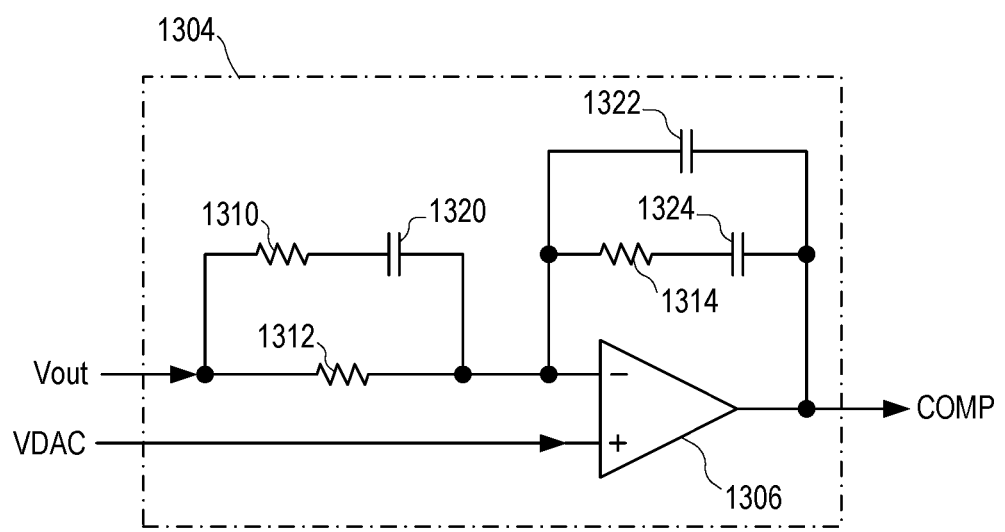
FIG. 13 illustrates an Error Amplifier (EA) including a compensation network, according to an embodiment.

FIG. 13 illustrates an Error Amplifier (EA) 1304 including a compensation network, according to an embodiment. The compensated EA 1304 is suitable for use as one or more of the EA 204 of FIG. 2, the EA 804 of FIG. 8, and the EA 1104 of FIG. 11.

The compensated EA 1304 includes a differential amplifier 1306, first, second, and third resistors 1310, 1312, and 1314, and first, second, and third capacitors 1320, 1322, and 1324. The first to third resistors 1310 to 1314 and the first to third capacitors 1320 to 1324 comprise the compensation network.

An output voltage Vout is coupled to first terminals of the first and second resistors 1310 and 1312. A second terminal of the first resistor 1310 is coupled to a first terminal of the first capacitor 1320. Second terminals of the second resistor 1312 and the first capacitor 1320 are coupled to an inverting input of the differential amplifier 1306.

First terminals of the second capacitor 1322 and the third resistor 1314 are also coupled to the inverting input of the differential amplifier 1306. A second terminal of the third resistor 1314 is coupled to a first terminal of the third capacitor 1324. Second terminals of the second and third capacitors 1322 and 1324 are coupled to an output of the differential amplifier 1306.

A reference signal VDAC is coupled to a non-inverting input of the differential amplifier 1306. The output of the differential amplifier 1306 produces a comparison signal COMP.

Embodiments of the present disclosure include electronic devices configured to perform one or more of the operations described herein. However, embodiments are not limited thereto.

While illustrative embodiments have been disclosed to aid in the understanding of the disclosure, embodiments are not limited thereto, but are instead limited only by the scope of the appended claims. Embodiment may include various modifications and equivalent arrangements included within the scope of the appended claims. The order of operations described in embodiments is illustrative and may be re-ordered unless otherwise constrained. Further, features of two or more embodiments may be combined to form a new embodiment.

What is claimed is:

1. A Pulse Width Modulation (PWM) controller for controlling a plurality of phases, the PWM controller comprising:
    a phase sequencer circuit to determine a selected phase of the plurality of phases;
    a common ramp generation circuit to generate a common ramp signal;
    a CSR signal multiplexer circuit to select a current sense signal of the selected phase from a plurality of current sense signals respectively corresponding to respective currents of the plurality of phases;
    a summing circuit to generate, using the common ramp signal and the current sense signal selected by the CSR signal multiplexer circuit, a comparison threshold signal; and
    a phase activation circuit to determine, using the comparison threshold signal, to turn on a PWM signal of the selected phase;
    wherein the common ramp generation circuit sets a value of the common ramp signal to a predetermined reset value in response to a PWM signal of the plurality of phases being turned on, and decreases or increases the value of the common ramp signal at a controlled rate otherwise.

2. The PWM controller of claim 1, further comprising:
    a plurality of Current Sense plus Ramp (CSR) signal generators to respectively generate a plurality of phase CSR signals according to the respective current sense signals of the plurality of phases; and
    a plurality of phase deactivation circuits to respectively determine, using the respective phase CSR signals, to turn off respective PWM signals of the plurality of phases.

3. The PWM controller of claim 2, further comprising:
an error amplifier to generate an error signal according to an error in a value of an output voltage relative to a value of a reference voltage,
wherein the phase activation circuit determines to turn on the PWM signal of the selected phase by comparing the error signal to the comparison threshold signal, and
wherein the plurality of phase deactivation circuits use the error signal to respectively determine to turn off the respective PWM signals of the plurality of phases.

4. The PWM controller of claim 3, wherein each of the plurality of phase deactivation circuits determine to turn off the respective PWM signal of the plurality of phases by comparing the error signal to the respective phase CSR signal.

5. The PWM controller of claim 2, wherein a first CSR signal generator of the plurality of CSR signal generators corresponding to a first phase of the plurality of phases comprises:
a capacitor; and
a current source,
wherein the first CSR signal generator produces a first phase CSR signal of the first phase by coupling the current source to the capacitor when a PWM signal of the first phase is turned on, and by coupling a current sense signal to the capacitor when the PWM signal of the first phase is turned off, and
wherein the current sense signal has a value corresponding to a current of the first phase.

6. The PWM controller of claim 1, wherein when a first phase of the plurality of phases is the selected phase, in response to the PWM signal of the first phase being turned on, the phase sequencer circuit determines the selected phase to be a phase of the plurality of phases other than the first phase.

7. The PWM controller of claim 1, wherein the controlled rate is proportional to the reference voltage or to an output voltage produced using the plurality of phases.

8. The PWM controller of claim 1, wherein the predetermined reset value is proportional to the reference voltage or to an output voltage produced using the plurality of phases.

9. The PWM controller of claim 1, wherein the respective currents of the plurality of phases are currents through respective inductors of the plurality of phases or are currents through respective Field Effect Transistors (FETs) of the plurality of phases.

10. A Pulse Width Modulation (PWM) controller for controlling a plurality of phases, the PWM controller comprising:
a phase sequencer circuit to determine a selected phase of the plurality of phases;
a PWM start detect circuit to assert a PWM start signal in response to an assertion of any of respective PWM signals of the plurality of phases;
a common ramp generation circuit to generate a common ramp signal by setting a value of the common ramp signal to a predetermined reset value in response to the assertion of the PWM start signal, and when PWM start signal is not asserted, decreasing or increasing the value of the common ramp signal at a rate determined by a reference voltage or an output voltage produced using the plurality of phases;
a CSR signal multiplexer circuit to select a current sense signal of the selected phase from a plurality of current sense signals respectively corresponding to respective currents of the plurality of phases;
a summing circuit to generate, using the common ramp signal and the current sense signal selected by the CSR signal multiplexer circuit, a comparison threshold signal;
a comparator circuit to generate a comparison high signal by comparing the comparison threshold signal to an error signal;
a plurality of phase activation circuits to determine, using the comparison high signal, to turn on a respective PWM signal of a respective phase of the plurality of phases when the respective phase is the selected phase;
a plurality of Current Sense plus Ramp (CSR) signal generators to respectively generate a plurality of phase CSR signals according to the respective current sense signals of the plurality of phases; and
a plurality of phase deactivation circuits to respectively determine, using the respective phase CSR signals and the error signal, to turn off respective PWM signals of the plurality of phases.

11. The PWM controller of claim 10, further comprising:
an error amplifier to generate the error signal according to an error in a value of an output voltage relative to a value of a reference voltage.

12. A method of controlling Pulse Width Modulation (PWM), the method comprising:
determining, using a sequencer circuit, a selected phase of a plurality of phases;
generating, using a common ramp generation circuit, a common ramp signal, including:
setting a value of the common ramp signal to a predetermined reset value in response to a PWM signal of the plurality of phases being turned on; and
decreasing or increasing the value of the common ramp signal at a controlled rate otherwise;
selecting, using a multiplexer circuit, a current sense signal of the selected phase from a plurality of current sense signals respectively corresponding to respective currents of the plurality of phases;
generating, using a summing circuit, a comparison threshold signal according to the common ramp signal and the selected current sense signal; and
determining, using the comparison threshold signal, to turn on a PWM signal of the selected phase.

13. The method of claim 12, further comprising:
generating, using a plurality of Current Sense plus Ramp (CSR) signal generators, a plurality of CSR signals according to the plurality of current sense signals, respectively; and
determining, using the plurality of CSR signals, to turn off one or more PWM signals of the plurality of phases, respectively.

14. The method of claim 13, further comprising:
generating an error signal according to an error in a value of an output voltage relative to a value of a reference voltage;
determining, using the error signal, to turn on the PWM signal of the selected phase; and
determining, using the error signal and the plurality of CSR signals, to turn off the one or more PWM signals of the plurality of phases, respectively.

15. The method of claim 14, wherein determining to turn off the one or more PWM signals of the plurality of phases is respectively performed by comparing the error signal to the one or more of the plurality of CSR signals.

16. The method of claim 14, further comprising:
determining the controlled rate using the reference voltage or using an output voltage produced using the one or more phases.

17. The method of claim 14, further comprising:
determining the predetermined reset value using the reference voltage or using an output voltage produced using the one or more phases.

18. The method of claim 12, further comprising:
when a first phase of the one or more phases is the selected phase, determining, in response to the PWM signal of the first phase being turned on and using the sequencer circuit, the selected phase to be a phase of the one or more phases other than the first phase.

19. The method of claim 12, further comprising:
generating a first CSR signal of the plurality of CSR signals by coupling a current source to a capacitor when a PWM signal of a first phase of the one or more phases is turned on; and
generating the first CSR signal by coupling a current sense signal respectively corresponding to a current of the first phase to the capacitor when the PWM signal of the first phase is turned off.

20. The method of claim 12, wherein the respective currents of the one or more phases are currents through respective inductors of the one or more phases or are currents through respective Field Effect Transistors (FETs) of the one or more phases.

\* \* \* \* \*